(12) United States Patent
Koli

(10) Patent No.: US 9,191,127 B2
(45) Date of Patent: Nov. 17, 2015

(54) SIGNAL FILTERING

(71) Applicant: ST-Ericsson SA, Plan-les-Ouates (CH)

(72) Inventor: Kimmo Koli, Turku (FI)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/363,954

(22) PCT Filed: Dec. 20, 2012

(86) PCT No.: PCT/EP2012/076344
§ 371 (c)(1),
(2) Date: Jun. 9, 2014

(87) PCT Pub. No.: WO2013/098182
PCT Pub. Date: Jul. 4, 2013

(65) Prior Publication Data
US 2015/0016492 A1    Jan. 15, 2015

Related U.S. Application Data

(60) Provisional application No. 61/585,395, filed on Jan. 11, 2012.

(30) Foreign Application Priority Data

Dec. 29, 2011  (EP) ................................ 11196127

(51) Int. Cl.
*H04B 1/10* (2006.01)
*H04B 15/00* (2006.01)
(Continued)

(52) U.S. Cl.
CPC ............ *H04B 15/00* (2013.01); *H03H 19/008* (2013.01); *H04B 1/40* (2013.01); *H04W 84/12* (2013.01)

(58) Field of Classification Search
CPC ............ H04B 1/12; H04B 1/18; H04B 1/30; H04B 1/1027; H04B 1/1036; G01S 3/065; G01S 19/36; H03G 3/345; H03G 3/344; H03G 3/34; H04L 1/20; H04L 25/03038; H04L 27/2647; H04L 25/03057; H04L 2025/03414

USPC ................. 375/229–236, 259–352; 455/91, 455/114.1–114.3, 130, 269–302

See application file for complete search history.

(56) References Cited

U.S. PATENT DOCUMENTS 5,471,665 A * 11/1995 Pace et al. ................. 455/343.2
6,348,830 B1 * 2/2002 Rebeiz et al. ............... 327/355
(Continued)

FOREIGN PATENT DOCUMENTS

EP    2 204 907 A1    7/2010

OTHER PUBLICATIONS

International Search Report issued in corresponding International application No. PCT/EP2012/076344, date of mailing Jun. 3, 2013.
(Continued)

*Primary Examiner* — James M Perez
(74) *Attorney, Agent, or Firm* — Patent Portfolio Builders PLLC

(57) ABSTRACT

A signal filter (100) comprises a first transferred impedance filter, TIF, ($TIF_A$) having four differential signal paths ($P_{A,1}$, $P_{A,2}$, $P_{A,3}$, $P_{A,4}$) and a second TIF ($TIF_B$) having four differential signal paths ($P_{B,1}$, $P_{B,2}$, $P_{B,3}$, $P_{B,4}$)- A first differential signal port of the first TIF ($32_A$) is coupled to a first differential signal port of the second TIF ($32_B$). A first clock generator ($12_A$) is arranged to provide first-TIF clock signals ($CLK_{A,I+}$, $CLK_{A,Q+}$, $CLK_{A,I-}$, $CLK_{A,Q-}$) having four non-overlapping phases for selecting the respective first-TIF differential signal paths ($P_{A,1}$, $P_{A,2}$, $P_{A,3}$, $P_{A,4}$), and a second clock generator ($12_B$) is arranged to provide second-TIF clock signals ($CLK_{B,I+}$, $CLK_{B,Q+}$, $CLK_{B,I-}$, $CLK_{B,Q-}$) having four non-overlapping phases for selecting the respective second-TIF differential signal paths ($P_{B,1}$, $P_{B,2}$, $P_{B,3}$, $P_{B,4}$). The phases of the second-TIF clock signals ($CLK_{B,I+}$, $CLK_{B,Q+}$, $CLK_{B,I-}$, $CLK_{B,Q-}$) are equal to the phases of the first-TIF clock signals ($CLK_{A,I+}$, $CLK_{A,Q+}$, $CLK_{A,I-}$, $CLK_{A,Q-}$) delayed by 45 degrees. The first-TIF first, second, third and fourth clock signals ($CLK_{A,I+}$, $CLK_{A,Q+}$, $CLK_{A,I-}$, $CLK_{AQ-}$) and the second-TIF first, second, third and fourth clock signals ($CLK_{B,I+}$, $CLK_{B,Q+}$, $CLK_{B,I-}$, $CLK_{B,Q-}$) have a duty cycle in the range 16.75% to 25%.

11 Claims, 12 Drawing Sheets

(51) Int. Cl.
*H03H 19/00* (2006.01)
*H04B 1/40* (2015.01)
*H04W 84/12* (2009.01)

(56) References Cited

U.S. PATENT DOCUMENTS

| | | | |
|---|---|---|---|
| 7,187,230 B2 | 3/2007 | Vilhonen | |
| 7,519,348 B2* | 4/2009 | Shah | 455/285 |
| 8,675,751 B2* | 3/2014 | Cannon et al. | 375/260 |
| 8,798,216 B2* | 8/2014 | Pullela et al. | 375/349 |
| 2006/0126702 A1* | 6/2006 | Burdett | 375/136 |
| 2006/0135109 A1* | 6/2006 | Klumperink et al. | 455/323 |
| 2006/0208791 A1* | 9/2006 | Vilhonen | 327/551 |
| 2006/0293017 A1* | 12/2006 | Kim et al. | 455/323 |
| 2008/0284487 A1* | 11/2008 | Pullela et al. | 327/355 |
| 2009/0191833 A1* | 7/2009 | Kaczman et al. | 455/296 |
| 2010/0029323 A1* | 2/2010 | Tasic et al. | 455/550.1 |
| 2010/0097258 A1* | 4/2010 | Koli | 341/155 |
| 2010/0151900 A1* | 6/2010 | Koli | 455/550.1 |
| 2011/0222633 A1* | 9/2011 | Pullela et al. | 375/318 |
| 2012/0063496 A1* | 3/2012 | Giannini et al. | 375/221 |
| 2012/0063555 A1* | 3/2012 | Pullela et al. | 375/350 |
| 2012/0171980 A1* | 7/2012 | Sivonen et al. | 455/293 |
| 2012/0200334 A1* | 8/2012 | Connell et al. | 327/359 |
| 2013/0015901 A1* | 1/2013 | Kitsunezuka | 327/356 |
| 2013/0154728 A1* | 6/2013 | Basaran et al. | 329/348 |
| 2013/0235959 A1* | 9/2013 | Nentwig | 375/349 |
| 2013/0335163 A1* | 12/2013 | Aggarwal et al. | 333/132 |

OTHER PUBLICATIONS

Extended European Search Report issued in corresponding European patent application No. 11 19 6127, date of completion May 18, 2012.
A. Ghaffari, et al.; "Tunable High-Q N-Path Band-Pass Filters: Modeling and Verification"; IEEE Journal of Solid-State Circuits; vol. 46, Issue 5; pp. 998-1010; May 2011.
K. Koli, et al.; "A 900 MHz Direct Delta-Sigma Receiver in 65 nm CMOS", IEEE Journal of Solid-State Circuits; vol. 45, Issue 12; pp. 2807-2818; Dec. 2010.

* cited by examiner

SIGNAL FILTERING

FIELD OF THE DISCLOSURE

The present disclosure relates to a signal filter, a down-conversion mixer comprising the signal filter, an up-conversion mixer comprising the signal filter, and a method of filtering a signal, having application in particular, but not exclusively, in wireless communication equipment for transmitting or receiving a radio frequency signal.

BACKGROUND TO THE DISCLOSURE

A transferred impedance filter (TIF), also known as a transferred impedance filter (TIF), utilising N-path filtering techniques, such as disclosed in U.S. Pat. No. 7,187,230 and in "Tunable high-Q N-path band-pass filters: modeling and verification", A. Ghaffari et al, IEEE J. of Solid-State Circuits, May 2011, can provide narrowband bandpass filtering centred at a switching frequency, that is, a local oscillator frequency. In US 2010/0097258 and in "A 900-MHz direct delta-sigma receiver in 65-nm CMOS", K. Koli et al, IEEE J. of Solid-State Circuits, December 2010, a direct delta-sigma receiver is disclosed employing TIFs.

A known 4-path TIF mixes a signal to a desired bandpass frequency range from odd harmonics of a local oscillator (LO) signal, using a switching duty cycle of 25%. The TIF acts as a high impedance for input frequencies close to the switching frequency, forming a high-Q bandpass filter centred at the switching frequency. A basic TIF circuit is a capacitively loaded passive mixer, and therefore it will mix signals from all odd harmonics of the LO signal. The stopband attenuation of the circuit is limited by the on-resistances of the switches employed in the TIF, and, near odd harmonics of the clock signal, additional bandpass resonances occur. The transfer function of such a 4-path TIF has repeated, but slightly attenuated, bandpass responses on every odd harmonic of the LO signal. The use of a switching duty cycle shorter than 25% can slightly improve the bandpass frequency selectivity, although attenuation at the odd harmonics of the LO signal is severely degraded, as described by Ghaffari et al.

In order to improve the harmonic rejection capabilities, more phases than four can be used to construct 6 or 8-path TIFs, as disclosed by Ghaffri et al. For example, mixing down from odd harmonics of the LO signal can be reduced by using, for example, an 8-path TIF with a 12.5% switching duty cycle. That, however, leads to reduced attenuation at harmonics of the clock signal, rendering the benefits of the circuit rather limited, while significantly increasing the maximum VCO frequency required for generating the LO signal. The main reason for the reduced attenuation is the shorter switch on-time, which limits the filtering at odd harmonics of the LO signal, while slightly reducing losses in the desired passband. The TIF is usually connected in parallel with a passive LC-resonator, which reduces the losses in the TIF passband, although this is insignificant compared with the losses of the passive LC-resonator. Furthermore, the harmonic rejection capabilities of the LC-resonator alone are not enough for typical applications, for example for wireless local area network (WLAN) coexistence in cellular transceivers.

Therefore, there is a requirement for improved filtering.

SUMMARY OF THE PREFERRED EMBODIMENTS

According to a first aspect, there is provided a signal filter comprising:
  a first transferred impedance filter, TIF, having first, second, third and fourth first-TIF differential signal paths;
  a second TIF having first, second, third and fourth second-TIF differential signal paths;
  a first differential signal port of the first TIF coupled to a first differential signal port of the second TIF;
  a first clock generator arranged to provide first-TIF first, second, third and fourth clock signals having non-overlapping phases for selecting, respectively, the first, second, third and fourth first-TIF differential signal paths; and
  a second clock generator arranged to provide second-TIF first, second, third and fourth clock signals having non-overlapping phases for selecting, respectively, the first, second, third and fourth second-TIF differential signal paths;
  wherein the phases of the second-TIF first, second, third and fourth clock signals are equal to the phases of, respectively, the first-TIF first, second, third and fourth clock signals delayed by forty-five degrees.

According to a second aspect, there is provided a method of filtering a signal using a first 4-differential-path transferred impedance filter, TIF, having a first differential signal port coupled to a first differential signal port of a second 4-differential-path transferred impedance filter, the method comprising:
  selecting respective differential signal paths of the first 4-differential-path transferred impedance filter, TIF, with first-TIF clock signals having four non-overlapping phases; and
  selecting respective differential signal paths of the second 4-differential-path transferred impedance filter with second-TIF clock signals having four non-overlapping phases;
  wherein the phases of the second-TIF clock signals are equal to the phases of the first-TIF clock signals delayed by 45 degrees.

Therefore, the signal filter may comprise two 4-differential-path TIFs coupled in parallel. Each of the TIFs may be clocked with clock signals having four non-overlapping phases, the phases of the clock signals used for clocking the second TIF being delayed by 45 degrees with respect to the phases of the clock signals used for clocking the first TIF. The signal filter and the method of filtering a signal can enable reduced harmonic folding, higher attenuation around odd harmonics of the frequency of the clock signals and reduced sensitivity to phase errors in the clock signals, without requiring an increased oscillator frequency for generating the clock signals. The use of differential signal paths can provide rejection of all even harmonics. Such a signal filter and method of filtering a signal may be used for radio frequency (RF) narrowband bandpass filtering without inductors, and have application, for example, in low band cellular or digital television receivers where integrated inductors have previously required intolerably large silicon areas in an integrated circuit.

In the signal filter according to the first aspect, the first-TIF first, second, third and fourth clock signals and the second-TIF first, second, third and fourth clock signals may have a duty cycle in the range 16.75% to 25%. Likewise, in the method according to the second aspect, the first-TIF first clock signals and the second-TIF clock signals may have a duty cycle in the range 16.75% to 25%.

In one embodiment, the first-TIF first, second, third and fourth clock signals and the second-TIF first, second, third and fourth clock signals may have a duty cycle in the range 20 to 25%, and preferably 25%, that is, a quarter. This can reduce folding from third, fifth, eleventh, thirteen and nineteenth harmonics of the frequency of the clock signal.

In another embodiment, the first-TIF first, second, third and fourth clock signals and the second-TIF first, second, third and fourth clock signals may have a duty cycle in the range 16.75 to 20.75%, and preferably 18.75%, that is, three sixteenths. This can enable reduced folding from seventh, ninth, fifteenth and seventeenth order harmonics of the frequency of the clock signal, for example by 15 to 30 dB.

The signal filter may comprise:

first component paths of the first, second, third and fourth first-TIF differential signal paths between a first component of the first differential signal port of the first TIF and, respectively, a first, second, third and fourth component of the second signal port of the first TIF;

second component paths of the first, second, third and fourth first-TIF differential signal paths between a second component of the first differential signal port of the first TIF and, respectively, the third, fourth, first and second components of the second signal port of the first TIF;

wherein the first component paths of the first, second, third and fourth first-TIF differential signal paths are selectable by means of, respectively, first-TIF first, second, third and fourth switch elements and the second component paths of the first, second, third and fourth first-TIF differential signal paths are selectable by means of, respectively, first-TIF fifth, sixth, seventh, and eighth switch elements;

first component paths of the first, second, third and fourth second-TIF differential signal paths between a first component of the first differential signal port of the second TIF and, respectively, a first, second, third and fourth component of the second signal port of the second TIF;

second component paths of the first, second, third and fourth second-TIF differential signal paths between a second component of the first differential signal port of the second TIF and, respectively, the third, fourth, first and second components of the second signal port of the second TIF;

wherein the first component paths of the first, second, third and fourth second-TIF differential signal paths are selectable by means of, respectively, second-TIF first, second, third and fourth switch elements and the second component paths of the first, second, third and fourth second-TIF differential signal paths are selectable by means of, respectively, second-TIF fifth, sixth, seventh, and eighth switch elements.

Therefore, the first and second TIFs can have an identical structure, which can simplify integrated circuit design, manufacture and testing.

The first TIF may comprise first-TIF first, second, third and fourth capacitive elements coupled between a ground and, respectively, the first, second, third and fourth components of the second signal port of the first TIF; and the second TIF may comprise second-TIF first, second, third and fourth capacitive elements coupled between the ground and, respectively, the first, second, third and fourth components of the second signal port of the second TIF. Such a uniform structure can simplify integrated circuit design, manufacture and testing.

The signal filter may comprise a first transconductance amplifier arranged to deliver to the second component of the second signal port of the first TIF a first current dependent on a voltage difference at the first and third components of the second signal port of the first TIF, and to deliver to the fourth component of the second signal port of the first TIF a second current dependent on a voltage difference at the first and third components of the second signal port of the first TIF; a second transconductance amplifier arranged to deliver to the first component of the second signal port of the first TIF a third current dependent on a voltage difference at the second and fourth components of the second signal port of the first TIF, and to deliver to the third component of the second signal port of the first TIF a fourth current dependent on a voltage difference at the second and fourth components of the second signal port of the first TIF; a third transconductance amplifier arranged to deliver to the second component of the second signal port of the second TIF a fifth current dependent on a voltage difference at the first and third components of the second signal port of the second TIF, and to deliver to the fourth component of the second signal port of the second TIF a sixth current dependent on a voltage difference at the first and third components of the second signal port of the second TIF; and a fourth transconductance amplifier arranged to deliver to the first component of the second signal port of the second TIF a seventh current dependent on a voltage difference at the second and fourth components of the second signal port of the second TIF, and to deliver to the third component of the second signal port of the second TIF an eighth current dependent on a voltage difference at the second and fourth components of the second signal port of the second TIF. This feature can provide compensation for a shift in centre frequency of bandpass filtering, caused by parasitic capacitance.

A down-conversion mixer may comprise the signal filter for down-converting an input signal applied to the first differential signal port of the first TIF and to the first differential signal port of the second, and further comprising a combining stage arranged to provide: at a first output of the down-conversion mixer the sum of voltages at the first and second components of the second signal port of the first TIF times a first gain and a voltage at the first component of the second signal port of the second TIF times a second gain, minus voltages at the third and fourth components of the second signal port of the first TIF times the first gain and a voltage at the third component of the second signal port of the second TIF times the second gain; and at a second output of the down-conversion mixer the sum of voltages at the second and third components of the second signal port of the first TIF times the first gain and a voltage at the second component of the second signal port of the second TIF times the second gain, minus voltages at the first and fourth components of the second signal port of the first TIF times the first gain and a voltage at the fourth component of the second signal port of the second TIF times the second gain; wherein the second gain is in the range 1.3 to 1.6 times the first gain.

Therefore, a down-conversion mixer can be provided having the advantages described above for the signal filter. Such a range of ratios between the first and second gains enables good harmonic rejection. The first gain may be unity.

Such a down-conversion mixer comprising the signal filter, for down-converting an input signal applied to the first differential signal port of the first TIF and to the first differential signal port of the second TIF, may comprise:

a first differential amplifier having a first non-inverting input coupled to the first component of the second signal port of the first TIF and a second inverting input coupled to the third component of the second signal port of the first TIF;

a second differential amplifier having a first inverting input coupled to the first component of the second signal port of the first TIF and a second non-inverting input coupled to the third component of the second signal port of the first TIF;

a third differential amplifier having a first non-inverting input coupled to the second component of the second signal port of the first TIF and a second inverting input coupled to the fourth component of the second signal port of the first TIF;

a fourth differential amplifier having a first non-inverting input coupled to the second component of the second signal port of the first TIF and a second inverting input coupled to the fourth component of the second signal port of the first TIF;

a fifth differential amplifier having a first non-inverting input coupled to the first component of the second signal port of the second TIF and a second inverting input coupled to the third component of the second signal port of the second TIF;

a sixth differential amplifier having a first non-inverting input coupled to the second component of the second signal port of the second TIF and a second inverting input coupled to the fourth component of the second signal port of the second TIF;

a first summing stage having a first input coupled to an output of the first differential amplifier, a second input coupled to an output of the third differential amplifier, a third input coupled to an output of the fifth differential amplifier, and an output coupled to a first output of the down-conversion mixer;

a second summing stage having a first input coupled to an output of the second differential amplifier, a second input coupled to an output of the fourth differential amplifier, a third input coupled to an output of the sixth differential amplifier, and an output coupled to a second output of the down-conversion mixer;

wherein the first, second, third and fourth differential amplifiers have a first gain and the fifth and sixth amplifiers have a second gain in the range 1.3 to 1.6 times the first gain. At least one of the first and second summing stages may comprise only resistors.

The second gain may be equal to the first gain times 1.5. Such a ratio between the first and second gain can enable improved harmonic rejection.

The second gain may be equal to the first gain times the square root of two. Such a ratio between the first and second gain can enable further improved harmonic rejection.

An up-conversion mixer comprising the signal filter, for up-converting an input signal comprising an in-phase component and a quadrature-phase component, may further comprise:

a first differential current source coupled to the first and third components of the second port of the first TIF for providing a first drive current equal to the difference between the in-phase and quadrature-phase components of the input signal times a first constant;

a second differential current source coupled to the second and fourth components of the second port of the first TIF for providing a second drive current equal to the sum of the in-phase and quadrature-phase components of the input signal times the first constant;

a third differential current source coupled to the first and third components of the second port of the second TIF for providing a third drive current in the range 1.3 to 1.6 times the in-phase component times the first constant;

a fourth differential current source coupled to the second and fourth components of the second port of the second TIF for providing a fourth drive current in the range 1.3 to 1.6 times the quadrature-phase component times the first constant.

Therefore, an up-conversion mixer can be provided having the advantages described above for the signal filter. Such a range of ratios between the third drive current and the in-phase component, and between the fourth drive current and the quadrature-phase component, enables good harmonic rejection. The first constant may be unity.

The third drive current may be equal to the in-phase component times the first constant times 1.5, and the fourth drive current may be equal to the quadrature-phase component times the first constant times 1.5. Such a ratio between the third drive current and the in-phase component, and between the fourth drive current and the quadrature-phase component, can enable improved harmonic rejection.

Alternatively, the third drive current may be equal to the in-phase component times the first constant times the square root of two, and the fourth drive current may be equal to the quadrature-phase component times the first constant times the square root of two. Such a ratio between the third drive current and the in-phase component, and between the fourth drive current and the quadrature-phase component, can enable further improved harmonic rejection.

There is also provided a wireless communication apparatus, for example a transmitter, receiver or transceiver, comprising the signal filter.

BRIEF DESCRIPTION OF THE DRAWINGS

Preferred embodiments will now be described, by way of example only, with reference to the accompanying drawings, in which.

DETAILED DESCRIPTION OF PREFERRED EMBODIMENTS

Figure 1:
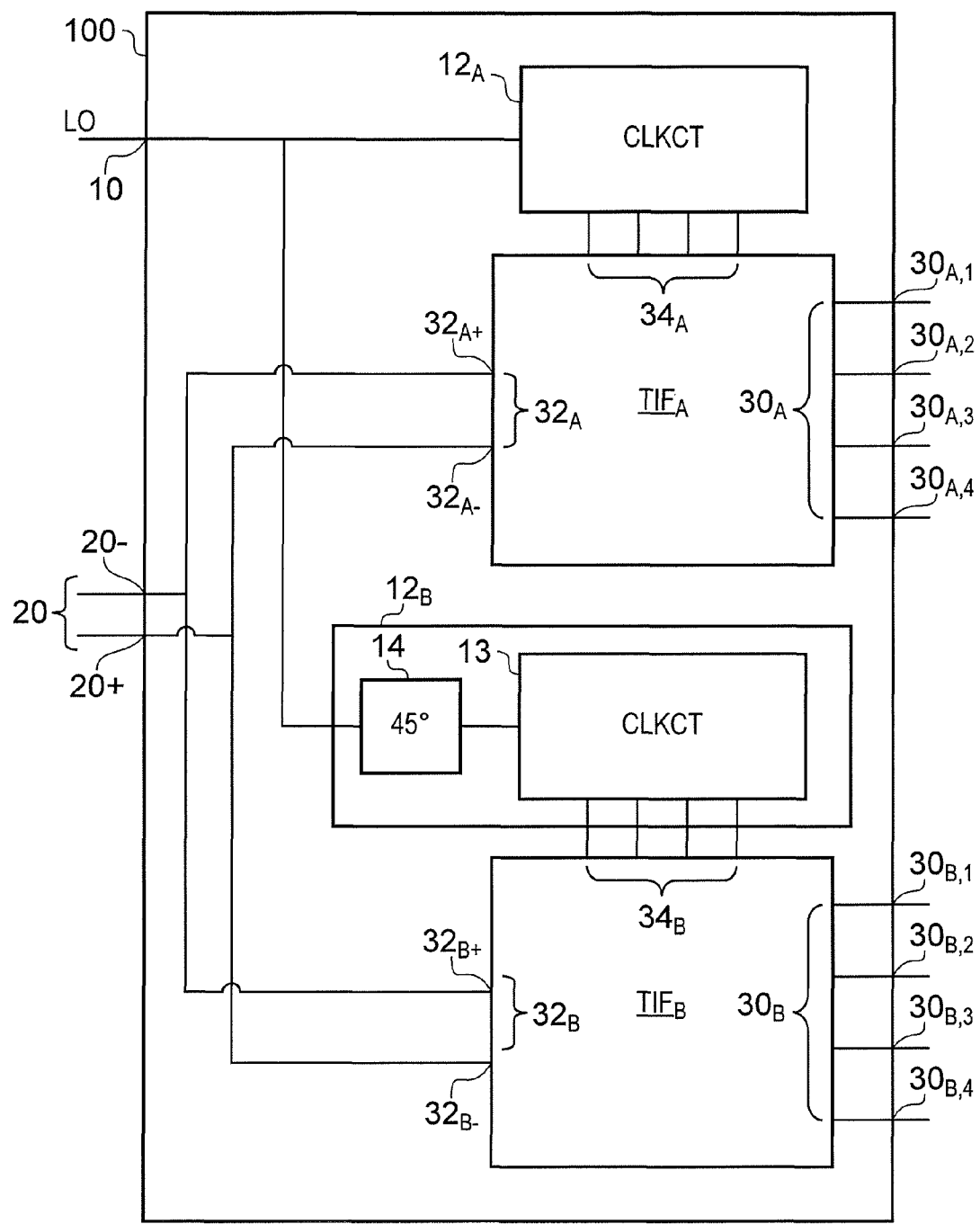
FIG. 1 is a schematic diagram of a signal filter.

Referring to FIG. 1, a signal filter 100 has a filter differential signal port 20 comprising first and second components 20+, 20−. The first and second components 20+, 20− of the filter differential signal port 20 are coupled to respective first and second components $32_{A+}$, $32_{A-}$ of a first differential signal port $32_A$ of a first transferred impedance filter $TIF_A$ and to respective first and second components $32_{B+}$, $32_{B-}$ of a first differential signal port $32_B$ of a second transferred impedance filter $TIF_B$. In this way, the first differential signal port $32_A$ of the first transferred impedance filter $TIF_A$ and the first differential signal port $32_B$ of the second transferred impedance filter $TIF_B$ are coupled together, the first transferred impedance filter $TIF_A$ and the second transferred impedance filter $TIF_B$ therefore being coupled in parallel. The first transferred impedance filter $TIF_A$ has a second signal port $30_A$ comprising first, second, third and fourth components $30_{A,1}$, $30_{A,2}$, $30_{A,3}$, $30_{A,4}$, and the second transferred impedance filter $TIF_B$ has a second signal port $30_B$ comprising first, second third and fourth components $30_{B,1}$, $30_{B,2}$, $30_{B,3}$, $30_{B,4}$. The first and second transferred impedance filters $TIF_A$, $TIF_B$ are four-differential-path transferred impedance filters, that is, each of the first and second transferred impedance filters $TIF_A$, $TIF_B$ provides four paths for a differential signal between their respective first differential signal ports $32_A$, $32_B$ and their respective second signal ports $30_A$, $30_B$.

A filter clock input 10 for a clock signal, also referred to as a local oscillator (LO) signal, is coupled to a first clock generator $12_A$ and to a second clock generator $12_B$. The first clock generator $12_A$ generates first-TIF four-phase, non-overlapping clock signals comprising a first-TIF first-phase clock signal $CLK_{A,I+}$, having a duty cycle of 25%, a first-TIF second-phase clock signal $CLK_{A,Q+}$ having a phase equal to the phase of the first-TIF first-phase clock signal $CLK_{A,I+}$, delayed by 90 degrees, a first-TIF third-phase clock signal $CLK_{A,I-}$ having a phase equal to the phase of the first-TIF second-phase clock signal $CLK_{A,Q+}$ delayed by 90 degrees, and a first-TIF fourth-phase clock signal $CLK_{A,Q-}$ having a phase equal to the phase of the first-TIF third-phase clock signal $CLK_{A,I+}$, delayed by 90 degrees. The first clock generator $12_A$ may generate the first-TIF four-phase, non-overlapping clock signals using a divide-by-four circuit, The first clock generator $12_A$ is coupled to a first clock port $34_A$ of the first transferred impedance filter $TIF_A$ for delivering the first-TIF four-phase, non-overlapping clock signals.

Figure 2:
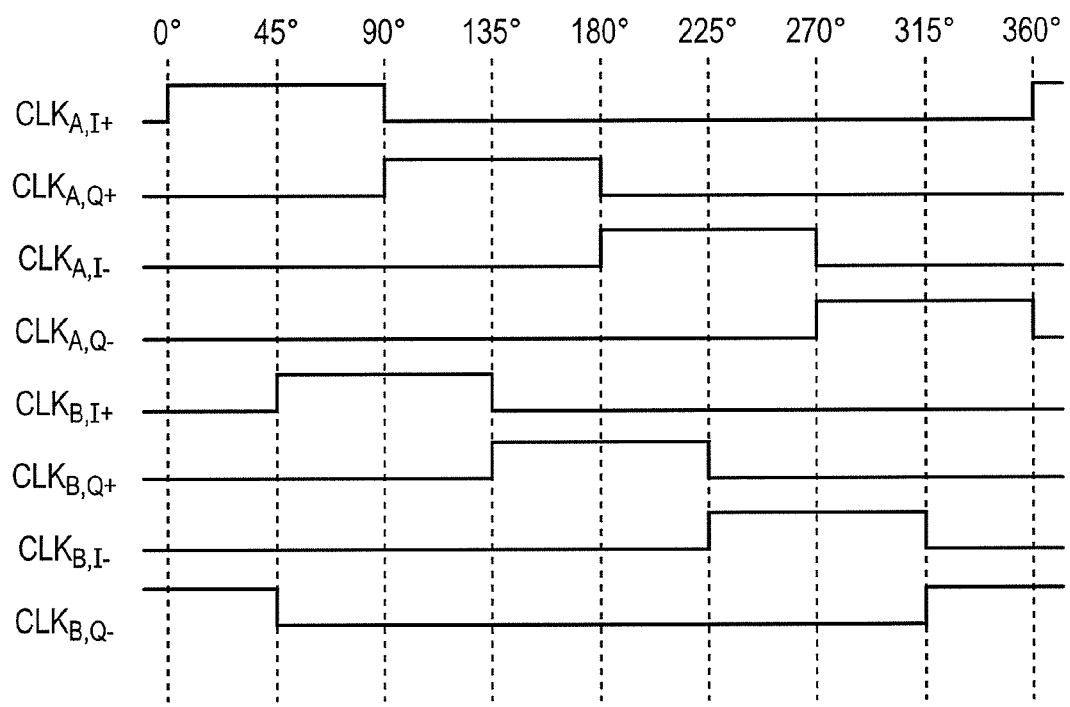
FIG. 2 illustrates waveforms of clock signals of the signal filter.

The second clock generator $12_B$ generator comprises a phase shift circuit 14 for generating a delayed LO signal, and a clock circuit 13 coupled to the phase shift circuit 14 for generating second-TIF four-phase, non-overlapping clock signals comprising a second-TIF first-phase clock signal $CLK_{B,I+}$, having a duty cycle of 25%, a second-TIF first-phase clock signal $CK_{B,Q+}$ having a phase equal to the phase of the second-TIF first-phase clock signal $CLK_{B,I+}$, delayed by 90 degrees, a second-TIF third-phase clock signal $CLK_{B,I-}$ having a phase equal to the phase of the second-TIF second-phase clock signal $CLK_{B,Q+}$ delayed by 90 degrees, and a second-TIF fourth-phase clock signal $CLK_{B,Q-}$ having a phase equal to the phase of the second-TIF third-phase clock signal $CLK_{B,I+}$, delayed by 90 degrees. The phase shift introduced by the phase shift circuit 14 is 45 degrees, that is, one eighth of the period of the LO signal. Therefore, the second-TIF four-phase, non-overlapping clock signals are equal in phase to the first-TIF four-phase, non-overlapping clock signals delayed by 45 degrees. The 45-degree time shift may be implemented in the phase shift circuit 14 by inverting the LO signal. For best accuracy of the phase shift, the LO signal can be a differential signal. Waveforms of the first-TIF and second-TIF four-phase, non-overlapping clock signals are illustrated in FIG. 2. The clock circuit 13 may be a copy of the first clock generator $12_A$. The second clock generator $12_B$ is coupled to a second clock port $34_B$ of the second transferred impedance filter $TIF_B$ for delivering the second-TIF four-phase, non-overlapping clock signals. Although a preferred duty cycle for the first-TIF and second-TIF four-phase non-overlapping clock signals is 25%, the duty cycle may be in the range 20% to 25%.

Figure 3:
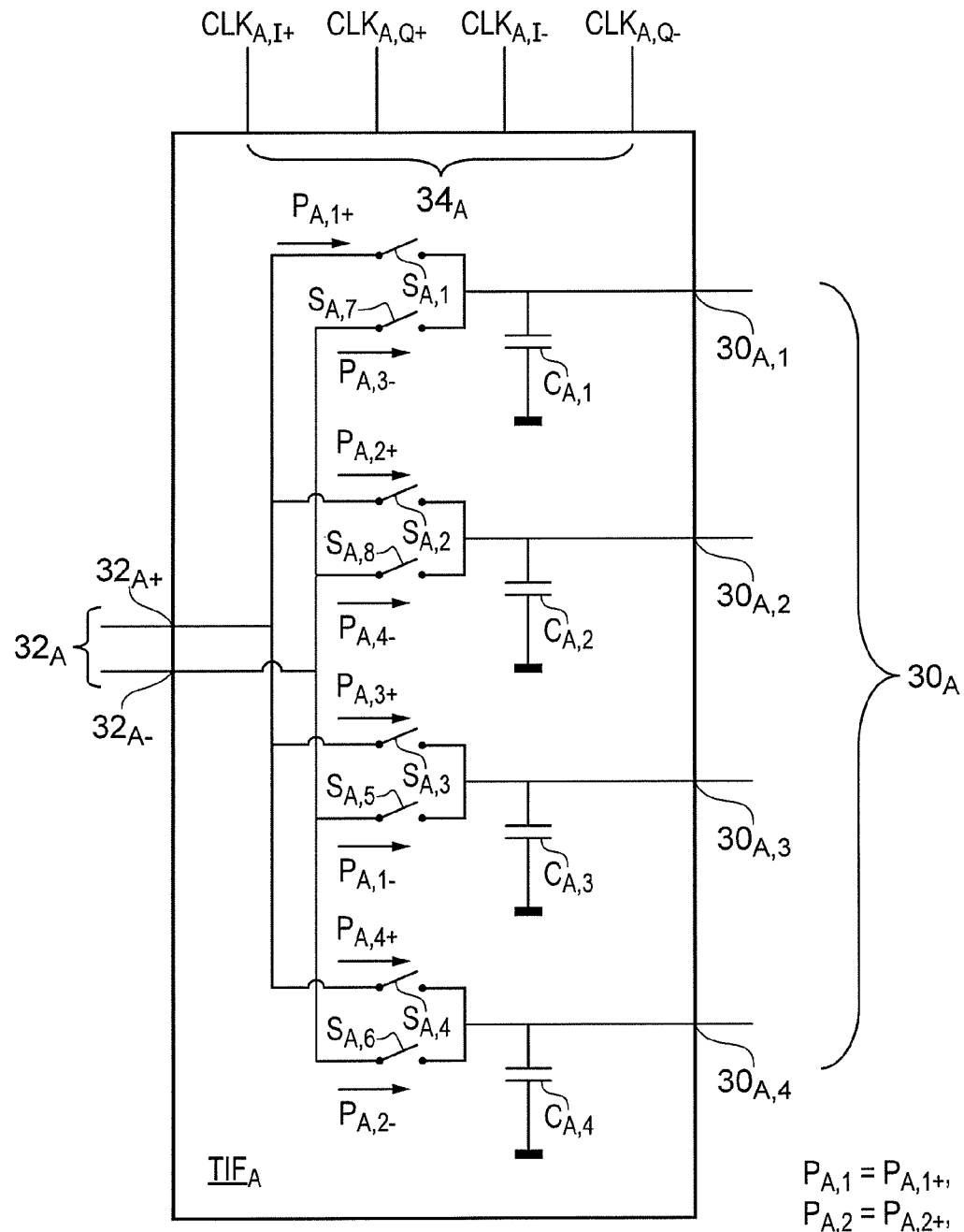
FIG. 3 illustrates a first transferred impedance filter.

Referring to FIG. 3, the first transferred impedance filter $TIF_A$ comprises first, second, third and fourth differential signal paths $P_{A,1}$, $P_{A,2}$, $P_{A,3}$, $P_{A,4}$ between the first differential signal port $32_A$ of the first transferred impedance filter $TIF_A$ and the second signal port $30_A$ of the first transferred impedance filter $TIF_A$, each of these differential signal paths comprising a first component and a second component.

In more detail, first component paths of the first, second, third and fourth first-TIF differential signal paths $P_{A,1+}$, $P_{A,2+}$, $P_{A,3+}$, $P_{A,4+}$ are provided between the first component of the first differential signal port of the first TIF $32_{A+}$ and, respectively, the first, second, third and fourth components of the second signal port of the first TIF $30_{A,1}$, $30_{A,2}$, $30_{A,3}$, $30_{A,4}$. Second component paths of the first, second, third and fourth first-TIF differential signal paths $P_{A,1-}$, $P_{A,2-}$, $P_{A,3-}$, $P_{A,4-}$ are provided between the second component of the first differential signal port of the first TIF $32_{A-}$ and, respectively, the third, fourth, first and second components of the second signal port of the first TIF $30_{A,3}$, $30_{A,4}$, $30_{A,1}$, $30_{A,2}$.

The first component paths of the first, second, third and fourth first-TIF differential signal paths $P_{A,1+}$, $P_{A,2+}$, $P_{A,3+}$, $P_{A,4+}$ are selectable by means of, respectively, first-TIF first, second, third and fourth switch elements $S_{A,1}$, $S_{A,2}$, $S_{A,3}$, $S_{A,4}$ which are coupled in the respective paths, under the control of the first-TIF four-phase, non-overlapping clock signals, and the second component paths of the first, second, third and fourth first-TIF differential signal paths $P_{A,1-}$, $P_{A,2-}$, $P_{A,3-}$, $P_{A,4-}$ are selectable by means of, respectively, first-TIF fifth, sixth, seventh, and eighth switch elements $S_{A,5}$, $S_{A,6}$, $S_{A,7}$, $S_{A,8}$ which are coupled in the respective paths, under the control of the first-TIF four-phase, non-overlapping clock signals. In particular, the first-TIF first-phase clock signal $CLK_{A,I+}$, controls the closure of the first-TIF first and fifth switch elements $S_{A,1}$, $S_{A,5}$ in, respectively, the first and second component paths of the first first-TIF differential signal path $P_{A,1+}$, $P_{A,1-}$. The first-TIF second-phase clock signal $CLK_{A,Q+}$ controls the closure of the first-TIF second and sixth switch elements $S_{A,2}$, $S_{A,6}$ in, respectively, the first and second component paths of the second first-TIF differential signal path $P_{A,2+}$, $P_{A,2-}$. The first-TIF third-phase clock signal $CLK_{A,I-}$ controls the closure of the first-TIF third and seventh switch elements $S_{A,3}$, $S_{A,7}$ in, respectively, the first and second component paths of the third first-TIF differential signal path $P_{A,3+}$, $P_{A,3-}$. The first-TIF fourth-phase clock signal $CLK_{A,Q-}$ controls the closure of the first-TIF fourth and eighth switch elements $S_{A,4}$, $S_{A,8}$ in, respectively, the first and second component paths of the fourth first-TIF differential signal path $P_{A,4+}$, $P_{A,4-}$.

The first transferred impedance filter $TIF_A$ also comprises first-TIF first, second, third and fourth capacitive elements $C_{A,1}$, $C_{A,2}$, $C_{A,3}$, $C_{A,4}$ coupled between a ground and respective ones of the first, second, third and fourth components $30_{A,1}$, $30_{A,2}$, $30_{A,3}$, $30_{A,4}$ of the second signal port $30_A$ of the first transferred impedance filter $TIF_A$. Therefore, by operation of the first-TIF first to eighth switch elements $S_{A,1}$ ... $S_{A,8}$, two of the first-TIF first to fourth capacitive elements $C_{A,1}$ ... $C_{A,4}$ are coupled to the first and second components 20+, 20− of the filter differential signal port 20 throughout operation of the signal filter 100, except for any relatively short periods of non-overlap during periods of changeover between the first TIF four-phase, non-overlapping clock signals.

Figure 4:
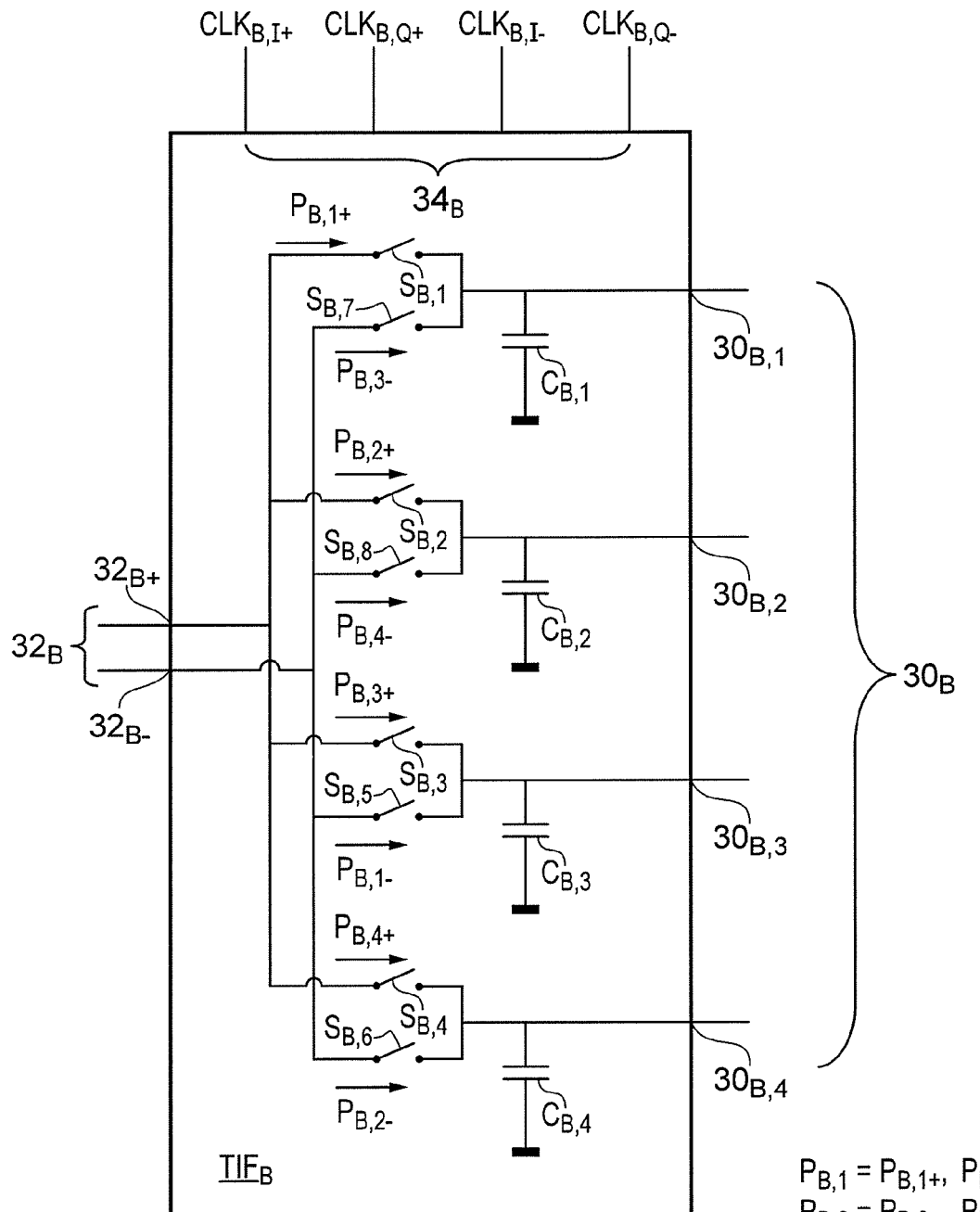
FIG. 4 illustrates a second transferred impedance filter.

Likewise, referring to FIG. 4, the structure of the second transferred impedance filter $TIF_B$ is identical to the structure of the first transferred impedance filter $TIF_A$. The second transferred impedance filter $TIF_B$ comprises first, second, third and fourth differential signal paths $P_{B,1}$, $P_{B,2}$, $P_{B,3}$, $P_{B,4}$ between the first differential signal port $32_B$ of the second transferred impedance filter $TIF_B$ and the second signal port $30_B$ of the second transferred impedance filter $TIF_B$, each of these differential signal paths comprising a first component and a second component.

In more detail, first component paths of the first, second, third and fourth second-TIF differential signal paths $P_{B,1+}$, $P_{B,2+}$, $P_{B,3+}$, $P_{B,4+}$ are provided between the first component of the first differential signal port of the second TIF $32_{B+}$ and, respectively, the first, second, third and fourth components of the second signal port of the second TIF $30_{B,1}$, $30_{B,2}$, $30_{B,3}$, $30_{B,4}$. Second component paths of the first, second, third and fourth second-TIF differential signal paths $P_{B,1-}$, $P_{B,2-}$, $P_{B,3-}$, $P_{B,4-}$ are provided between the second component of the first differential signal port of the second TIF $32_{B-}$ and, respectively, the third, fourth, first and second components of the second signal port of the second TIF $30_{B,3}, 30_{B,4}, 30_{B,1}, 30_{B,2}$.

The first component paths of the first, second, third and fourth second-TIF differential signal paths $P_{B,1+}, P_{B,2+}, P_{B,3+}, P_{B,4+}$ are selectable by means of, respectively, second-TIF first, second, third and fourth switch elements $S_{B,1}, S_{B,2}, S_{B,3}, S_{B,4}$ which are coupled in the respective paths, under the control of the second-TIF four-phase, non-overlapping clock signals, and the second component paths of the first, second, third and fourth second-TIF differential signal paths $P_{B,1-}, P_{B,2-}, P_{B,3-}, P_{B,4-}$ are selectable by means of, respectively, second-TIF fifth, sixth, seventh, and eighth switch elements $S_{B,5}, S_{B,6}, S_{B,7}, S_{B,8}$ which are coupled in the respective paths, under the control of the second-TIF four-phase, non-overlapping clock signals. In particular, the second-TIF first-phase clock signal $CLK_{B,I+}$, controls the closure of the second-TIF first and fifth switch elements $S_{B,1}, S_{B,5}$ in, respectively, the first and second component paths of the first second-TIF differential signal path $P_{B,1+}, P_{B,1-}$. The second-TIF second-phase clock signal $CLK_{B,Q+}$ controls the closure of the second-TIF second and sixth switch elements $S_{B,2}, S_{B,6}$ in, respectively, the first and second component paths of the second second-TIF differential signal path $P_{B,2+}, P_{B,2-}$. The second-TIF third-phase clock signal $CLK_{B,I-}$ controls the closure of the second-TIF third and seventh switch elements $S_{B,3}, S_{B,7}$ in, respectively, the first and second component paths of the third second-TIF differential signal path $P_{B,3+}, P_{B,3-}$. The second-TIF four-phase clock signal $CLK_{B,Q-}$ controls the closure of the second-TIF fourth and eighth switch elements $S_{B,4}, S_{B,8}$ in, respectively, the first and second component paths of the fourth second-TIF differential signal path $P_{B,4+}, P_{B,4-}$.

The second transferred impedance filter $TIF_B$ also comprises second-TIF first, second, third and fourth capacitive elements $C_{B,1}, C_{B,2}, C_{B,3}, C_{B,4}$ coupled between a ground and respective ones of the first, second, third and fourth components $30_{B,1}, 30_{B,2}, 30_{B,3}, 30_{B,4}$ of the second signal port of the second transferred impedance filter $TIF_B$. Therefore, by operation of the first to eighth switch elements $S_{B,1} \ldots S_{B,8}$ of the second transferred impedance filter $TIF_B$, two of the second TIF first to fourth capacitive elements $C_{B,1} \ldots C_{B,4}$ are coupled to the first and second components 20+, 20− of the filter differential signal port 20 throughout operation of the signal filter 100, except for any relatively short periods of non-overlap during periods of changeover between the second TIF four-phase, non-overlapping clock signals. The first-TIF first, second, third and fourth capacitive elements $C_{A,1}, C_{A,2}, C_{A,3}, C_{A,4}$ and the second-TIF first, second, third and fourth capacitive elements $C_{B,1}, C_{B,2}, C_{B,3}, C_{B,4}$ have equal capacitance values, although some mismatch can be acceptable.

Referring again to FIG. 2, during the period 0° to 45°, by operation of, that is, in response to, the first-TIF first-phase clock signal $CLK_{A,I+}$, the first-TIF first capacitive element $C_{A,1}$ is coupled to the first component 20+ of the filter differential signal port 20, and the first-TIF third capacitive element $C_{A,3}$ is coupled to the second component 20− of the filter differential signal port 20. Also during the period 0° to 45°, by operation of the second-TIF fourth-phase clock signal $CLK_{B,Q-}$, the second-TIF fourth capacitive element $C_{B,4}$ is coupled to the first component 20+ of the filter differential signal port 20, and the second-TIF second capacitive element $C_{A,2}$ is coupled to the second component 20− of the filter differential signal port 20.

During the period 45° to 90°, by operation of the first-TIF first-phase clock signal $CLK_{A,I+}$, the first-TIF first capacitive element $C_{A,1}$ remains coupled to the first component 20+ of the filter differential signal port 20, and the first-TIF third capacitive element $C_{A,3}$ remains coupled to the second component 20− of the filter differential signal port 20. Also during the period 45° to 90°, by operation of the second-TIF first-phase clock signal $CLK_{B,I+}$, the second-TIF first capacitive element $C_{B,1}$ is coupled to the first component 20+ of the filter differential signal port 20, and the second-TIF third capacitive element $C_{B,3}$ is coupled to the second component 20− of the filter differential signal port 20.

During the period 90° to 135°, by operation of the first-TIF second-phase clock signal $CLK_{A,Q+}$, the first-TIF second capacitive element $C_{A,2}$ is coupled to the first component 20+ of the filter differential signal port 20, and the first-TIF fourth capacitive element $C_{A,4}$ is coupled to the second component 20− of the filter differential signal port 20. Also during the period 90° to 135°, by operation of the second-TIF first-phase clock signal $CLK_{B,I+}$, the second-TIF first capacitive element $C_{B,1}$ remains coupled to the first component 20+ of the filter differential signal port 20, and the second-TIF third capacitive element $C_{B,3}$ remains coupled to the second component 20− of the filter differential signal port 20.

During the period 135° to 180°, by operation of the first-TIF second-phase clock signal $CLK_{A,Q+}$, the first-TIF second capacitive element $C_{A,2}$ remains coupled to the first component 20+ of the filter differential signal port 20, and the first-TIF fourth capacitive element $C_{A,4}$ remains coupled to the second component 20− of the filter differential signal port 20. Also during the period 135° to 180°, by operation of the second-TIF second-phase clock signal $CLK_{B,Q+}$, the second-TIF second capacitive element $C_{B,2}$ is coupled to the first component 20+ of the filter differential signal port 20, and the second-TIF fourth capacitive element $C_{B,4}$ is coupled to the second component 20− of the filter differential signal port 20.

During the period 180° to 225°, by operation of the first-TIF third-phase clock signal $CLK_{A,I-}$, the first-TIF third capacitive element $C_{A,3}$ is coupled to the first component 20+ of the filter differential signal port 20, and the first-TIF first capacitive element $C_{A,1}$ is coupled to the second component 20− of the filter differential signal port 20. Also during the period 180° to 225°, by operation of the second-TIF second-phase clock signal $CLK_{B,Q+}$, the second-TIF second capacitive element $C_{B,2}$ remains coupled to the first component 20+ of the filter differential signal port 20, and the second-TIF fourth capacitive element $C_{B,4}$ remains coupled to the second component 20− of the filter differential signal port 20.

During the period 225° to 270°, by operation of the first-TIF third-phase clock signal $CLK_{A,I-}$, the first-TIF third capacitive element $C_{A,3}$ remains coupled to the first component 20+ of the filter differential signal port 20, and the first-TIF first capacitive element $C_{A,1}$ remains coupled to the second component 20− of the filter differential signal port 20. Also during the period 225° to 270°, by operation of the second-TIF third-phase clock signal $CLK_{B,I-}$, the second-TIF third capacitive element $C_{B,3}$ is coupled to the first component 20+ of the filter differential signal port 20, and the second-TIF first capacitive element $C_{B,1}$ is coupled to the second component 20− of the filter differential signal port 20.

During the period 270° to 315°, by operation of the first-TIF fourth-phase clock signal $CLK_{A,Q-}$, the first-TIF fourth capacitive element $C_{A,4}$ is coupled to the first component 20+ of the filter differential signal port 20, and the first-TIF second capacitive element $C_{A,2}$ is coupled to the second component 20− of the filter differential signal port 20. Also during the period 270° to 315°, by operation of the second-TIF third-phase clock signal $CLK_{B,I-}$, the second-TIF third capacitive element $C_{B,3}$ remains coupled to the first component 20+ of the filter differential signal port 20, and the second-TIF first capacitive element $C_{B,1}$ remains coupled to the second component 20– of the filter differential signal port 20.

During the period 315° to 360°, by operation of the first-TIF fourth-phase clock signal $CLK_{A,Q-}$, the first-TIF fourth capacitive element $C_{A,4}$ remains coupled to the first component 20+ of the filter differential signal port 20, and the first-TIF second capacitive element $C_{A,2}$ remains coupled to the second component 20– of the filter differential signal port 20. Also during the period 315° to 360°, by operation of the second-TIF fourth-phase clock signal $CLK_{B,Q-}$, the second-TIF fourth capacitive element $C_{B,4}$ is coupled to the first component 20+ of the filter differential signal port 20, and the second-TIF second capacitive element $C_{B,2}$ is coupled to the second component 20– of the filter differential signal port 20.

Therefore, with this switch timing, each first-TIF first to fourth capacitive elements $C_{A,1} \ldots C_{A,4}$ is first connected in parallel with one of the second-TIF first to fourth capacitive elements $C_{B,1} \ldots C_{B,4}$ from a 45 degree earlier phase for one eighth of the LO signal period, and then with another of the second-TIF first to fourth capacitive element $C_{B,1} \ldots C_{B,4}$ from a 45 degrees later phase for one eighth of the LO signal period. With an ideal 45-degree phase difference, no folding from the third and fifth harmonics of the clock signal frequency will occur, while the seventh and ninth harmonics are folded.

Figure 5:
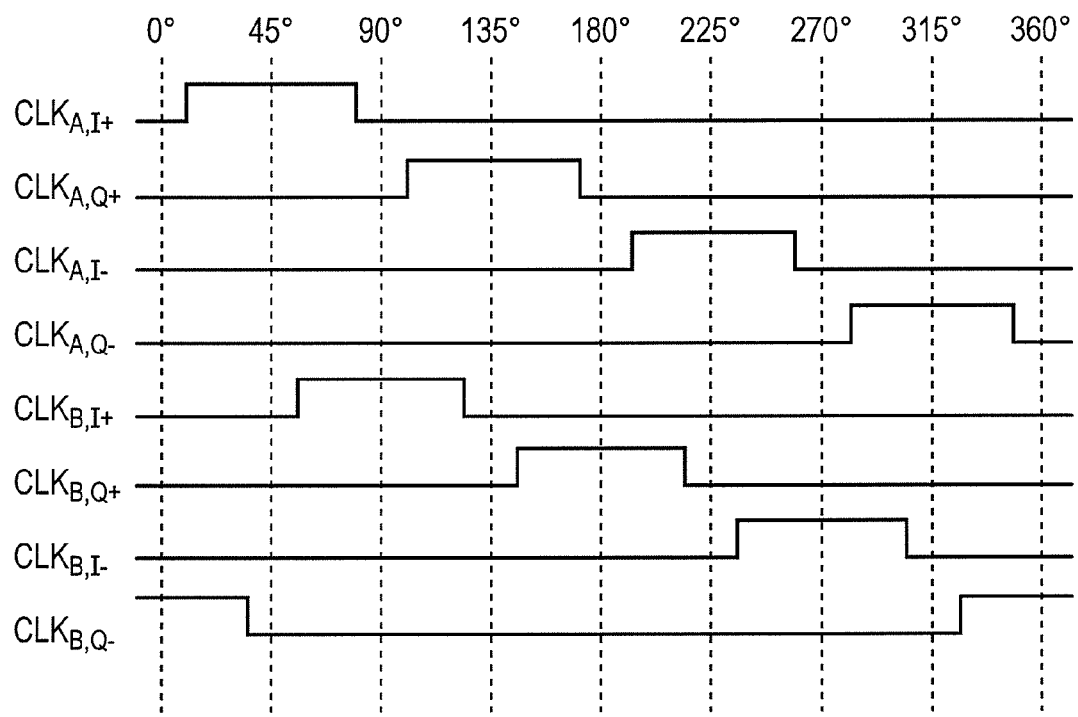
FIG. 5 illustrates waveforms of clock signals of another embodiment of the signal filter.

In a variation of the signal filter 100, the duty cycle of the first-TIF and second-TIF four-phase, non-overlapping clock signals is 3/16, that is, 18.75%, but the signal filter 100 is otherwise as described above with reference to FIGS. 1 to 4. Although a preferred duty cycle for the first-TIF and second-TIF four-phase non-overlapping clock signals is 18.75%, the duty cycle may be in the range 16.75% to 20.75%. Waveforms of the first-TIF and second-TIF four-phase, non-overlapping clock signals having a duty cycle of 18.75% are illustrated in FIG. 5. In this case, there is a period of 22.5 degrees, that is, one sixteenth of a clock signal period between the end of each of the four-phase non-overlapping clock signals and the start of the next one of those phases. Moreover, each of the first-TIF first- to fourth capacitive elements $C_{A,1} \ldots C_{A,4}$ is first connected in parallel with one of the second-TIF first to fourth capacitive elements $C_{B,1} \ldots C_{B,4}$ from a 45 degree earlier phase for one sixteenth of the LO signal period, and then with another of the second-TIF first to fourth capacitive element $C_{B,1} \ldots C_{B,4}$ from a 45 degrees later phase for one sixteenth of the clock signal period, with an intermediate interval of one sixteenth of the clock signal period in which only one of the first-TIF first to fourth capacitive elements $C_{A,1} \ldots C_{A,4}$ is connected, without any of the second-TIF first to fourth capacitive elements $C_{B,1} \ldots C_{B,4}$ being connected. Therefore, the non-overlap time and each overlap time is equal. This condition is met with a duty cycle of 3/16 if the non-zero rise and fall times of the signals are neglected. With an ideal 45 degree phase difference between the first-TIF four-phase, non-overlapping clock signals and the second-TIF four-phase, non-overlapping clock signals, no folding from third and fifth harmonic of the clock signal frequency occurs, while the seventh and ninth harmonic are folded, but at a 15 to 30 dB lower level.

Therefore, with either the 25% or 18.75% duty cycle, less folding from all harmonics of the clock signal frequency occurs than with single 4-path or 8-path differential TIF.

Figure 6:
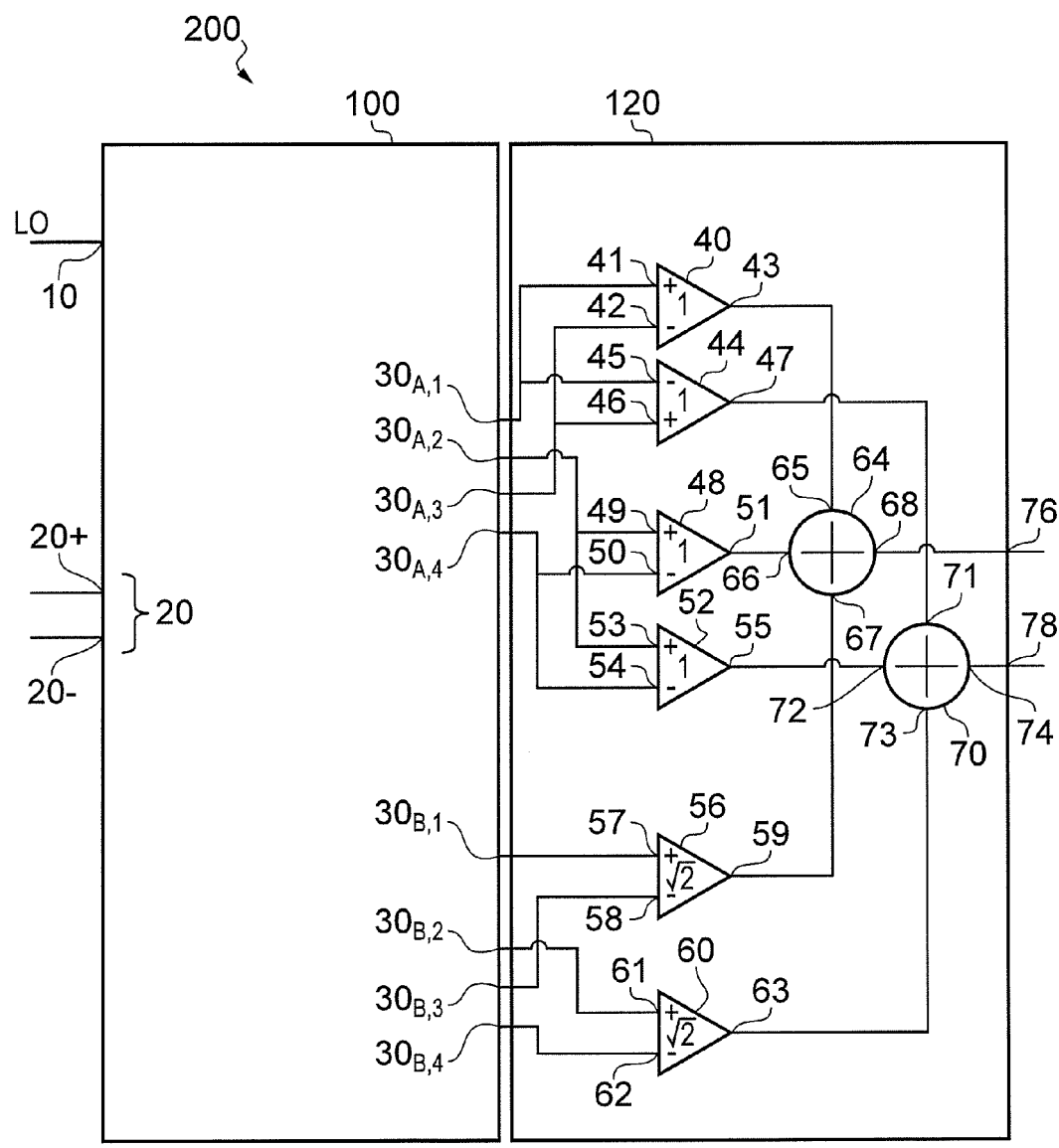
FIG. 6 is a schematic diagram of a down-conversion mixer.

Referring to FIG. 6, a down-conversion mixer 200 comprises the signal filter 100 and is arranged for down-converting a differential input signal provided at the filter differential signal port 20. This differential input signal may be, for example, a radio frequency (RF) signal. A first differential amplifier 40 has a first non-inverting input 41 and a second inverting input 42 coupled to, respectively, the first component $30_{A,1}$ and the third component $30_{A,3}$ of the second signal port $30_A$ of the first transferred impedance filter $TIF_A$. A second differential amplifier 44 has a first inverting input 45 and a second non-inverting input 46 coupled to, respectively, the first component $30_{A,1}$ and the third component $30_{A,3}$ of the second signal port $30_A$ of the first transferred impedance filter $TIF_A$. A third differential amplifier 48 has a first non-inverting input 49 and a second inverting input 50 coupled to, respectively, the second component $30_{A,2}$ and the fourth component $30_{A,4}$ of the second signal port $30_A$ of the first transferred impedance filter $TIF_A$. A fourth differential amplifier 52 has a first non-inverting input 53 and a second inverting input 54 coupled to, respectively, the second component $30_{A,2}$ and the fourth component $30_{A,4}$ of the second signal port $30_A$ of the first transferred impedance filter $TIF_A$. A fifth differential amplifier 56 has a first non-inverting input 57 and a second inverting input 58 coupled to, respectively, the first component $30_{B,1}$ and the third component $30_{B,3}$ of the second signal port $30_B$ of the second transferred impedance filter $TIF_B$. A sixth differential amplifier 60 has a first non-inverting input 61 and a second inverting input 62 coupled to, respectively, the second component $30_{B,2}$ and the fourth component $30_{A,4}$ of the second signal port $30_B$ of the second transferred impedance filter $TIF_B$.

The first, second, third and fourth differential amplifiers 40, 44, 48, 52 each have a first gain, and the fifth and sixth amplifiers 56, 60 have a second gain which is a multiple of the first gain. The multiple is in the range 1.3 to 1.6. In one preferred embodiment, the multiple is the square root of two, that is, 1.414. For example, the first gain may be unity and the second gain may be 1.414, as illustrated in FIG. 6. In another preferred embodiment, the multiple is 1.5. For example, the first gain may be unity and the second gain may be 1.5.

A first summing stage 64 has a first input 65 coupled to an output 43 of the first differential amplifier 40, a second input 66 coupled to an output 51 of the third differential amplifier 48, a third input 67 coupled to an output 59 of the fifth differential amplifier 56, and an output 68 coupled to a first output 76 of the down-conversion mixer 200. A second summing stage 70 has a first input 71 coupled to an output 47 of the second differential amplifier 44, a second input 72 coupled to an output 55 of the fourth differential amplifier 52, a third input 73 coupled to an output 63 of the sixth differential amplifier 60, and an output 74 coupled to a second output 78 of the down-conversion mixer 200. The first and second summing stages 64, 70 may be implemented with passive circuitry using resistive elements coupled to a virtual ground. The down-conversion mixer 200 mixes down the differential input signal provided at the filter differential signal port 20 and the delivers at its first output 76 an in-phase component of the mixed down signal and delivers at its second output 78 a quadrature-phase component of the mixed down signal. The first to sixth differential amplifiers 40, 44, 48, 52, 56, 60 and the first and second summing stages 64, 70 together form a combining stage 120.

In the down-conversion mixer 200, a finite on resistance of the first-TIF first to eighth switch elements $S_{A,1} \ldots S_{A,8}$ and of the second-TIF first to eighth switch elements $S_{B,1} \ldots S_{B,8}$ may limit the available stop-band attenuation for an RF differential input signal provided at the filter differential signal port 20, but this limitation does not apply to the down-converted signal at the first and second outputs 76, 78 of the down-conversion mixer 200.

Figure 7:
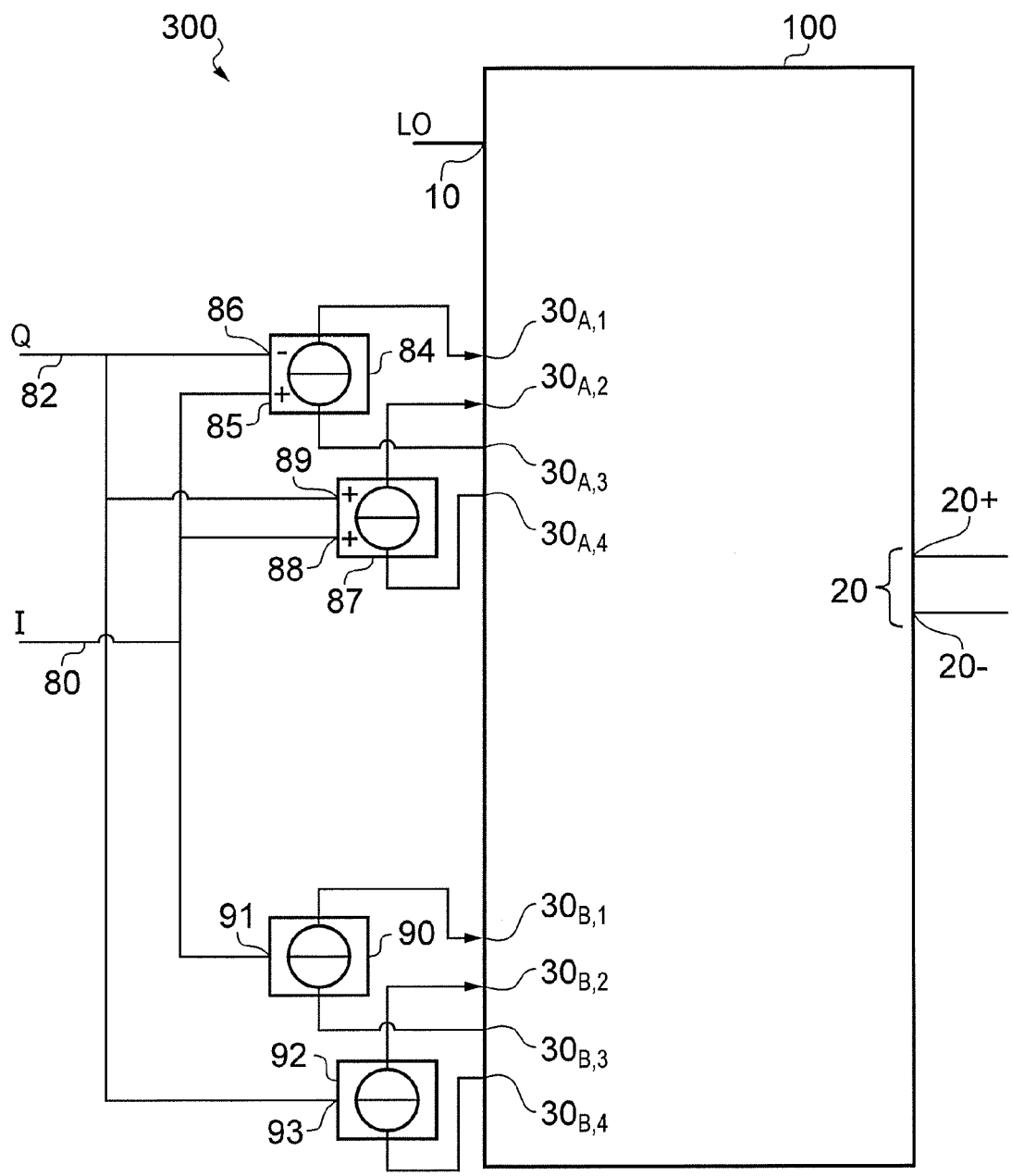
FIG. 7 is a schematic diagram of an up-conversion mixer.

Referring to FIG. 7, an up-conversion mixer 300 comprises the signal filter 100 and is arranged for up-converting in-phase and quadrature-phase components I,Q of an input signal provided at, respectively, an in-phase input 80 and a quadrature-phase input 82 of the up-conversion mixer 300. The up-converted signal is delivered by the signal filter 100, at the filter differential signal port 20. The up-conversion mixer 300 also comprises a first current source 84 having a first input 85 coupled to the in-phase input 80 for receiving the in-phase component I of the input signal and a second input 86 coupled to the quadrature-phase input 82 for receiving the quadrature-phase component Q of the input signal. The first current source 84 is coupled between the first component $30_{A,1}$ and the third component $30_{A,3}$ of the second signal port $30_A$ of the first transferred impedance filter $TIF_A$ and is arranged to deliver a current to the signal filter 100 which is proportional to the difference, I−Q, between the in-phase component I and the quadrature-phase component Q of the input signal.

A second current source 87 has a first input 88 coupled to the in-phase input 80 for receiving the in-phase component I of the input signal and a second input 89 coupled to the quadrature-phase input 82 for receiving the quadrature-phase component Q of the input signal. The second current source 87 is coupled between the second component $30_{A,2}$ and the fourth component $30_{A,4}$ of the second signal port $30_A$ of the first transferred impedance filter $TIF_A$ and is arranged to deliver a current to the signal filter 100 which is proportional to the sum, I+Q, of the in-phase component I and the quadrature-phase component Q of the input signal.

A third current source 90 has an input 91 coupled to the in-phase input 80 for receiving the in-phase component I of the input signal and is coupled between the first component $30_{B,1}$ and the third component $30_{B,3}$ of the second signal port $30_B$ of the second transferred impedance filter $TIF_B$ and is arranged to deliver a current to the signal filter 100 which is proportional to the in-phase component I of the input signal. Likewise, a fourth current source 92 has an input 93 coupled to the quadrature-phase input 82 for receiving the quadrature-phase component Q of the input signal and is coupled between the second component $30_{B,2}$ and the fourth component $30_{B,4}$ of the second signal port $30_B$ of the second transferred impedance filter $TIF_B$ and is arranged to deliver a current to the signal filter 100 which is proportional to the quadrature-phase component Q of the input signal.

The first current source 84 has a gain which is equal to the current delivered to the signal filter 100 by the first current source 84 divided by the difference between in-phase component I provided at the first input 85 of the first current source 84 and the quadrature-phase component Q provided at the second input 86 of the first current source 84. Likewise, the second current source 87 has a gain which is equal to the current delivered to the signal filter 100 by the second current source 87 divided by the sum of the in-phase component I provided at the first input 88 of the second current source 87 and the quadrature-phase component Q provided at the second input 89 of the second current source 87. The gain of the first current source 84 is equal to the gain of the second current source 87.

The third current source 90 has a gain that is equal to the current delivered to the signal filter 100 by the third current source 90 divided by the in-phase component I provided at the input 91 of the third current source 90. Likewise, the fourth current source 92 has a gain that is equal to the current delivered to the signal filter 100 by the fourth current source 92 divided by the quadrature-phase component Q provided at the input 93 of the fourth current source 92. The gain of the third current source 90 is equal to the gain of the fourth current source 92, and is a multiple of the gain of the first and second current sources 84, 87. This multiple is in the range 1.3 to 1.6. In one preferred embodiment, the multiple is the square root of two, that is, 1.414. For example, the gain of the first and second current sources 84, 87 may be unity and the gain of the third and fourth current sources 90, 92 may be 1.414. In another preferred embodiment, the multiple is 1.5. For example, the gain of the first and second current sources 84, 87 may be unity and the gain of the third and fourth current sources 90, 92 may be 1.5.

The first, second, third and fourth current sources 84, 87, 90, 92 may be differential floating current sources, and may be implemented as current steering digital-to-analogue converters. The first current source 84 may determine the difference, I−Q, between the in-phase component I and the quadrature-phase component Q, and the second current source 87 may determine the sum, I+Q, of the in-phase component I and the quadrature-phase component Q, in digital domain, or by connecting separate digital-to-analogue converters for the in-phase and quadrature-phase components in parallel to drive the first-TIF first, second, third and fourth capacitive elements $C_{A,1}$, $C_{A,2}$, $C_{A,3}$, $C_{A,4}$. The third and fourth current sources 90, 92 may employ scaled unit current cells to provide the required gain for the currents to drive the second-TIF first, second, third and fourth capacitive elements $C_{B,1}$, $C_{B,2}$, $C_{B,3}$, $C_{B,4}$.

Harmonic rejection by the up-conversion mixer 300 suppresses undesired odd harmonics of the clock signal in the up-converted signal delivered by the signal filter 100 at the filter differential signal port 20. The up-conversion mixer 300 may comprise filters for band-limiting the in-phase and quadrature-phase components before they are provided to the first, second, third and fourth current sources 84, 87, 90, 92, which can also contribute to the spectral purity of the up-converted signal delivered by the signal filter 100 at the filter differential signal port 20. Furthermore, in a wireless transmitter, following up-conversion, a pre-power amplifier and a power amplifier may provide more attenuation of far-off noise.

Figures 8A, 8B, 8C, 8D:
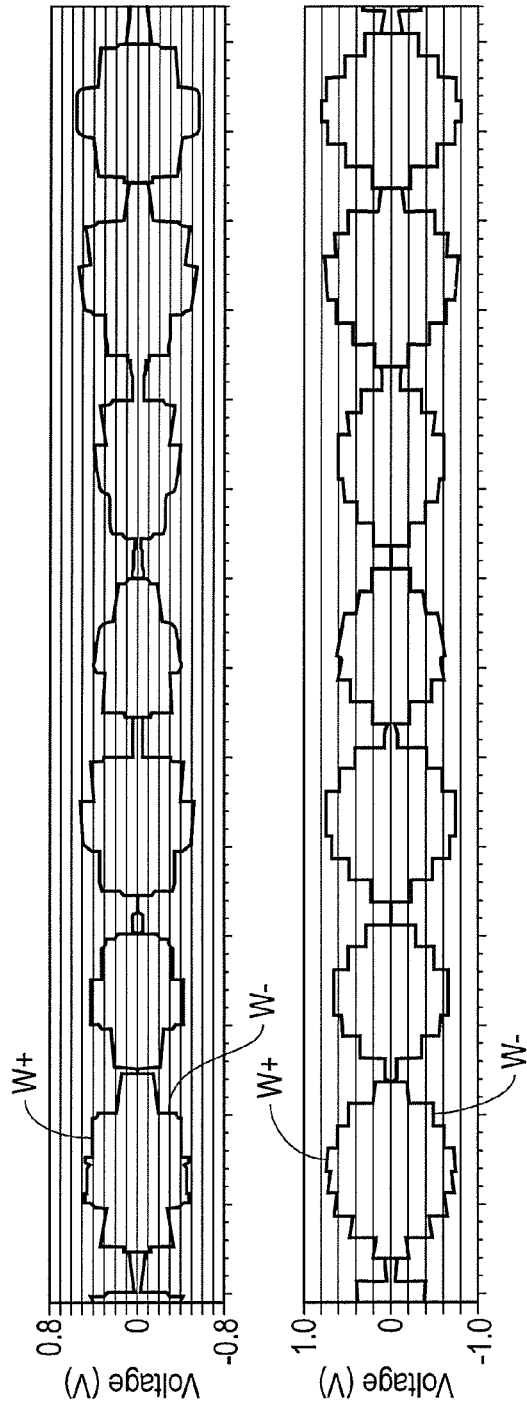
FIGS. 8A to 8D illustrate waveforms of an up-converted signal.

FIG. 8A illustrates differential waveforms W+, W− of the up-converted signal at RF delivered by the signal filter 100 at the filter differential signal port 20 of the up-conversion mixer 300 for the case of the first and second TIF four-phase, non-overlapping clock signals having a duty cycle of 25%, and FIG. 8B illustrates the corresponding waveforms W+, W− for the case of the first and second TIF four-phase, non-overlapping clock signals having a duty cycle of 18.75%. In both cases, no folding of the third and fifth harmonic of the clock signal occurs. Folding of the seventh and ninth harmonic of the clock signal occurs, although this is at a level 15 to 30 dB lower in the case of a duty cycle of 18.75%, compared with 25%. For comparison, FIGS. 8C and 8D illustrate, respectively, the corresponding waveforms for a prior art single four-path TIF and a 25% clock duty cycle and a prior art eight-path TIF with a 12.5% clock duty cycle, both of which have poorer rejection of odd harmonics of the clock signal.

When the signal filter 100 is used in applications where parasitic capacitance can affect operation, for example where the down-conversion mixer 200 is down-converting an RF signal present at the filter differential signal port 20 and parasitic capacitance is present at the filter differential signal port 20, very low-Q inductors can be used to tune out of parasitic capacitance at the filter differential signal port 20. Alternatively, a shift of centre frequency caused by parasitic capacitance can be compensated by turning the first and second transferred impedance filters $TIF_A$, $TIF_B$ into complex filters by adding transconductance amplifiers feeding a correction current from a 90 degree earlier switching phase. Such an arrangement is illustrated in FIG. 9 for the first transferred impedance filter $TIF_A$, and a corresponding arrangement is illustrated in FIG. 10 for the second transferred impedance filter $TIF_B$.

Figure 9:
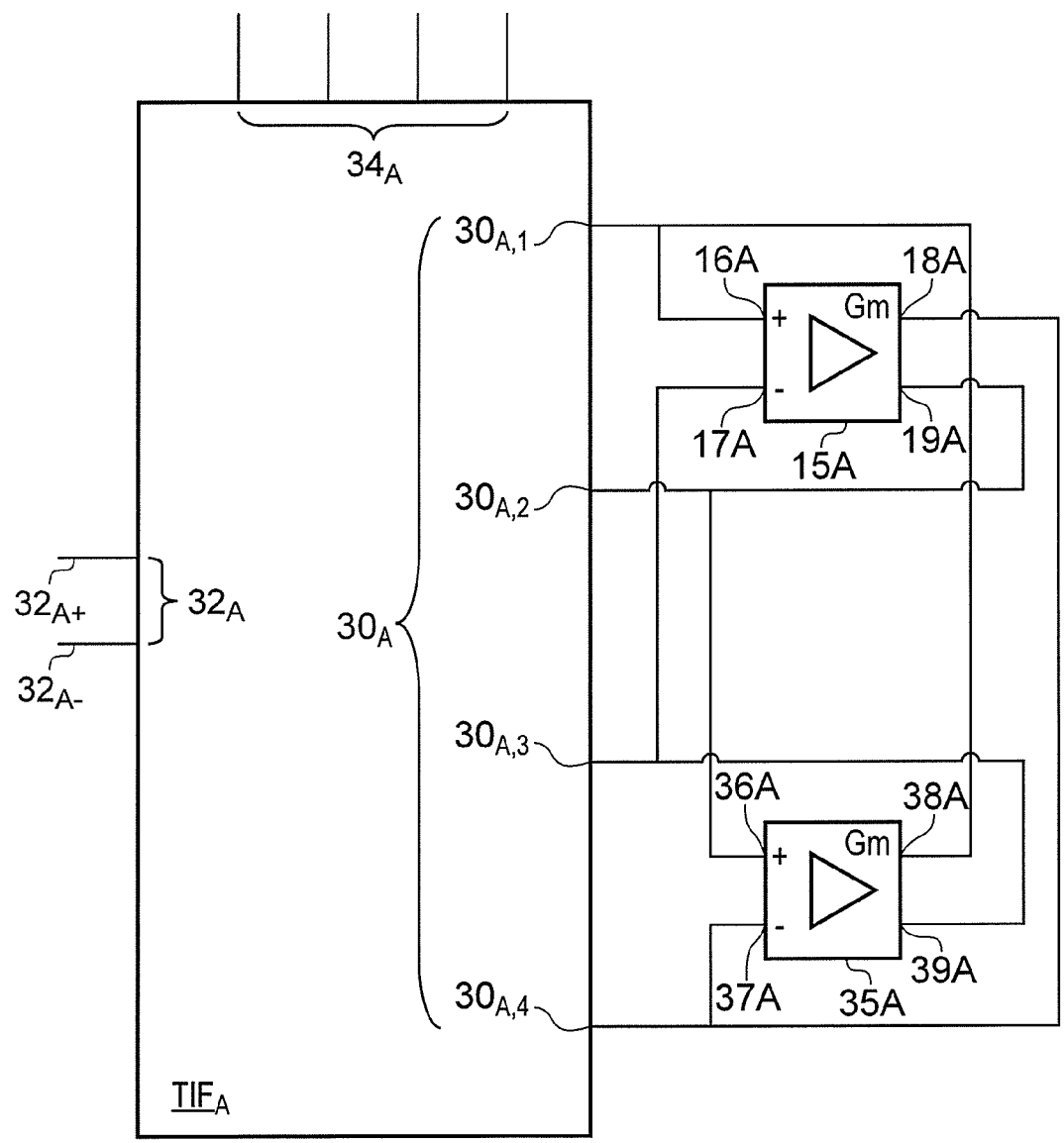
FIG. 9 is a schematic diagram of a first TIF with capacitance compensation.

Referring to FIG. 9, a first transconductance amplifier 15A has a non-inverting input 16A and an inverting input 17A coupled to, respectively, the first component $30_{A,1}$ and the third component $30_{A,3}$ of the second signal port $30_A$ of the first transferred impedance filter $TIF_A$. A first output 18A and a second output 19A of the first transconductance amplifier 15A are coupled to, respectively, the fourth component $30_{A,4}$ and the second component $30_{A,2}$ of the second signal port $30_A$ of the first transferred impedance filter $TIF_A$. A second transconductance amplifier 35A has a non-inverting input 36A and an inverting input 37A coupled to, respectively, the second component $30_{A,2}$ and the fourth component $30_{A,4}$ of the second signal port $30_A$ of the first transferred impedance filter $TIF_A$. A first output 38A and a second output 39A of the second transconductance amplifier 35A are coupled to, respectively, the first component $30_{A,1}$ and the third component $30_{A,3}$ of the second signal port $30_A$ of the first transferred impedance filter $TIF_A$. The first transconductance amplifier 15A delivers to the second component of the second signal port of the first TIF $30_{A,2}$ a first current dependent on a voltage difference at the first and third components of the second signal port of the first TIF $30_{A,1}$, $30_{A,3}$, and delivers to the fourth component of the second signal port of the first TIF $30_{A,4}$ a second current dependent on a voltage difference at the first and third components of the second signal port of the first TIF $30_{A,1}$, $30_{A,3}$. The second transconductance amplifier 35A delivers to the first component of the second signal port of the first TIF $30_{A,1}$ a third current dependent on a voltage difference at the second and fourth components of the second signal port of the first TIF $30_{A,2}$, $30_{A,4}$, and delivers to the third component of the second signal port of the first TIF $30_{A,3}$ a fourth current dependent on a voltage difference at the second and fourth components of the second signal port of the first TIF $30_{A,2}$, $30_{A,4}$.

Figure 10:
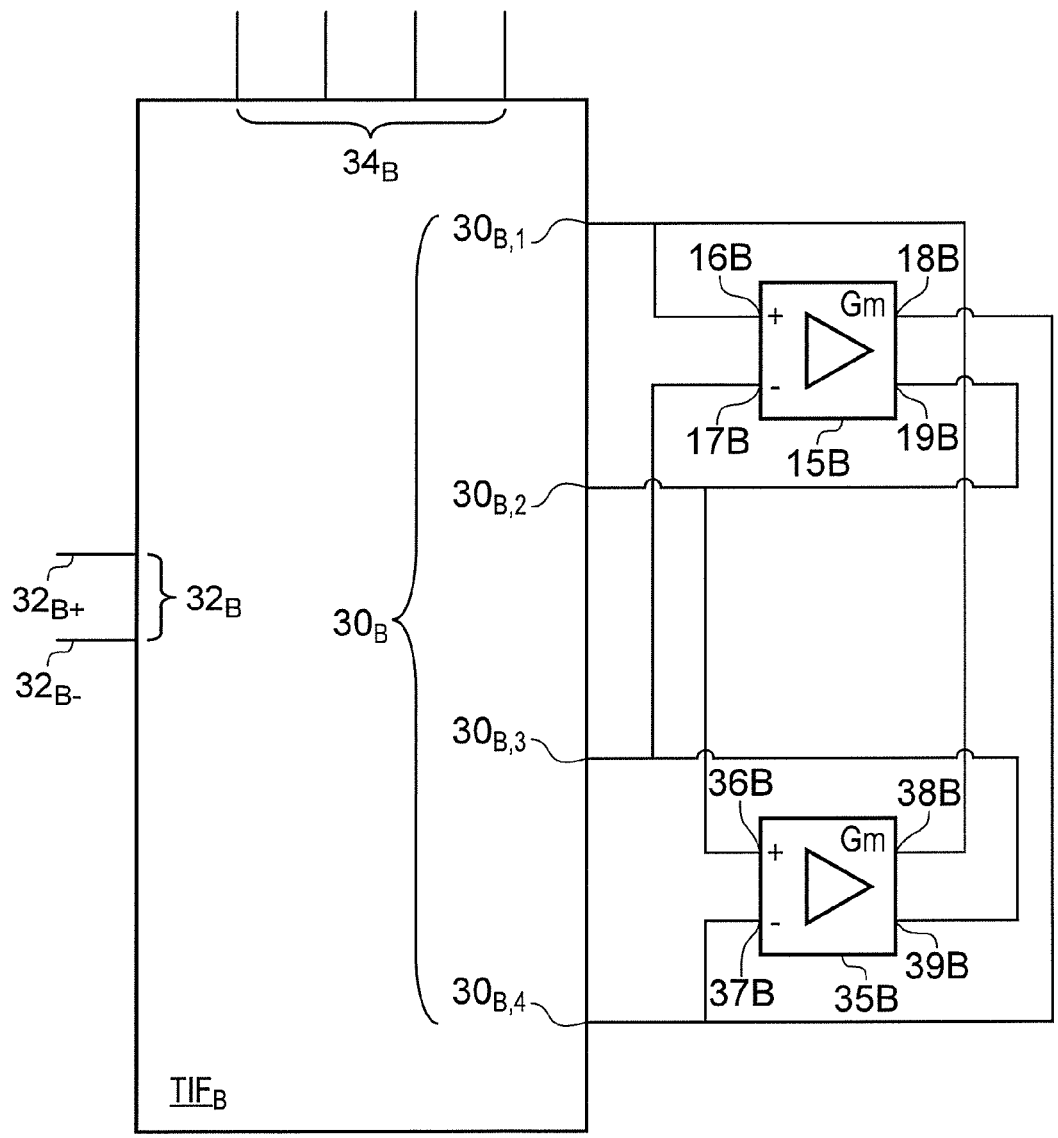
FIG. 10 is a schematic diagram of a second TIF with capacitance compensation.

Referring to FIG. 10, a third transconductance amplifier 15B has a non-inverting input 16B and an inverting input 17B coupled to, respectively, the first component $30_{B,1}$ and the third component $30_{B,3}$ of the second signal port $30_B$ of the second transferred impedance filter $TIF_B$. A first output 18B and a second output 19B of the second transconductance amplifier 1B are coupled to, respectively, the fourth component $30_{B,4}$ and the second component $30_{B,2}$ of the second signal port $30_B$ of the second transferred impedance filter $TIF_B$. A fourth transconductance amplifier 35B has a non-inverting input 36B and an inverting input 37B coupled to, respectively, the second component $30_{B,2}$ and the fourth component $30_{B,4}$ of the second signal port $30_B$ of the first transferred impedance filter $TIF_B$. A first output 38B and a second output 39B of the fourth transconductance amplifier 35B are coupled to, respectively, the first component $30_{B,1}$ and the third component $30_{B,3}$ of the second signal port $30_B$ of the second transferred impedance filter $TIF_B$. The third transconductance amplifier 15B delivers to the second component of the second signal port of the second TIF $30_{B,2}$ a fifth current dependent on a voltage difference at the first and third components of the second signal port of the second TIF $30_{B,1}$, $30_{B,3}$, and delivers to the fourth component of the second signal port of the second TIF $30_{B,4}$ a sixth current dependent on a voltage difference at the first and third components of the second signal port of the second TIF $30_{B,1}$, $30_{B,3}$. The fourth transconductance amplifier 35B delivers to the first component of the second signal port of the second TIF $30_{B,1}$ a seventh current dependent on a voltage difference at the second and fourth components of the second signal port of the second TIF $30_{B,2}$, $30_{B,4}$, and delivers to the third component of the second signal port of the second TIF $30_{B,3}$ an eighth current dependent on a voltage difference at the second and fourth components of the second signal port of the second TIF $30_{B,2}$, $30_{B,4}$.

The first, second, third and fourth transconductance amplifiers 15A, 35A, 15B, 35B can be implemented with two simple differential stages or four simple common-source stages with minimal increase in chip area of an integrated circuit, current consumption and noise. Other connections between the second signal port $30_A$ of the first transferred impedance filter $TIF_A$ and the first to fourth differential amplifiers 40, 44, 48, 52, and between the second signal port $30_B$ of the second transferred impedance filter $TIF_B$ and the fifth and sixth differential amplifiers 56, 60 are unchanged, remaining the same as described above. Additionally, the shift of centre frequency caused by parasitic capacitance can be utilised by using the down-conversion mixer 200 in a low intermediate frequency (IF) configuration rather than a zero-IF configuration.

Figure 11:
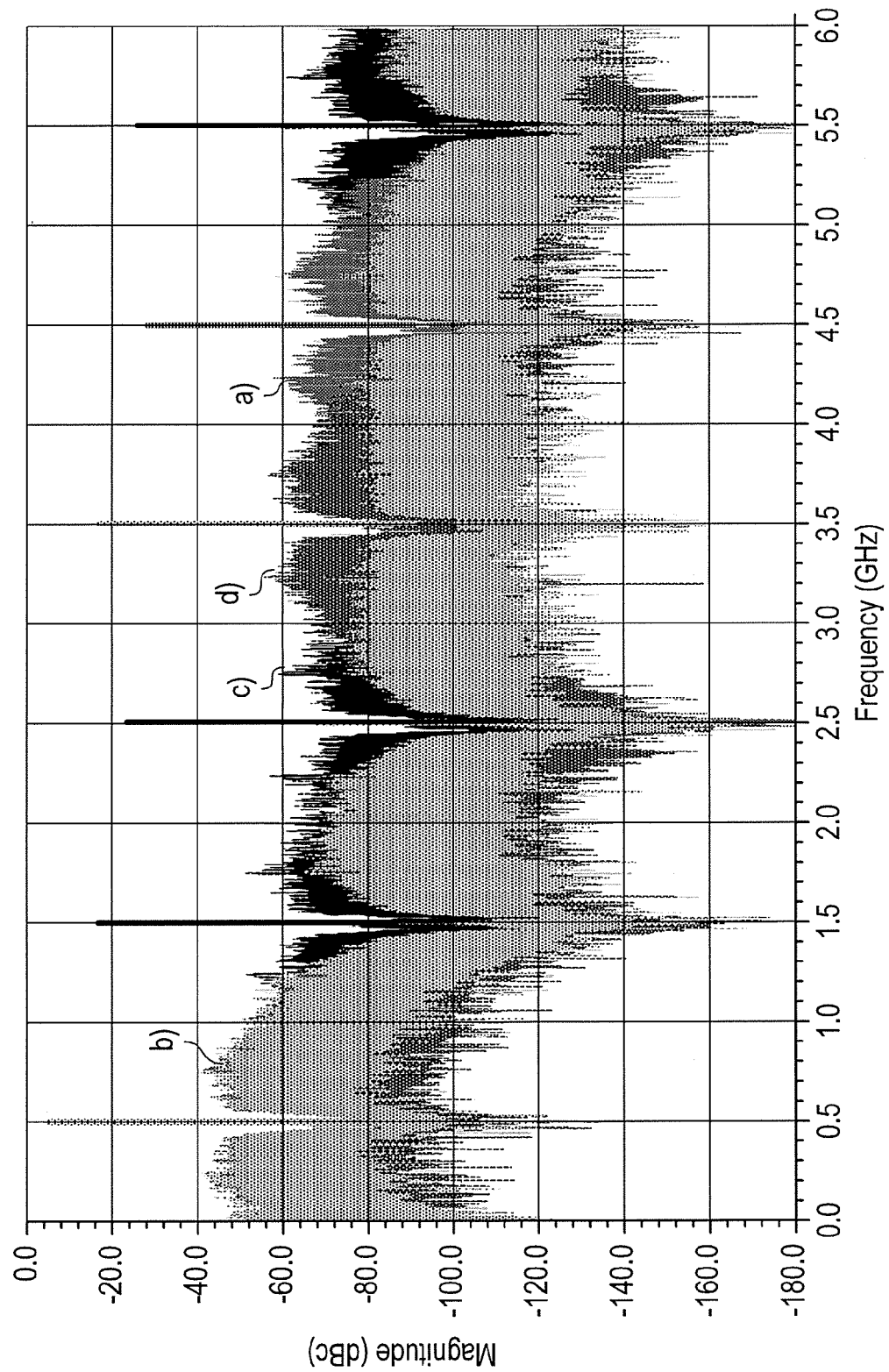
FIG. 11 illustrates RF spectra of an up-converted signal.

The band-limited up-conversion with harmonic rejection, by the up-conversion mixer 300, enables a delta-sigma modulated digital-to-analogue converter to be implemented with a higher clock rate than local oscillator frequency. For optimal performance, values of the ratio local oscillator frequency/clock frequency can be ½, 1, 1½, 2, 2½ . . . and so on. Such a feature can be used, in particular, for a direct delta-sigma receiver which combines a continuous-time delta-sigma modulator and direct conversion receiver together with feedback from baseband to RF. This is demonstrated in FIG. 11, which illustrates the spectrum at RF of a signal after up-conversion. In particular, in the case of graph a) of FIG. 11, in-phase and quadrature-phase 1-bit 1 GHz bit streams generated with a third order delta-sigma modulator are up-converted to 500 MHz with 1-bit current digital-to-analogue converters feeding the in-phase input 80 and the quadrature-phase input 82 of the up-conversion mixer 300 with the first-TIF and second-TIF four-phase, non-overlapping clock signals having a duty cycle of 25%, and graph b) of FIG. 11 illustrates the corresponding spectrum for the case of the first-TIF and second-TIF four-phase, non-overlapping clock signals having a duty cycle of 18.75%. An extremely clean output spectrum is achieved across an extremely wide range of frequencies at the output of the digital-to-analogue converters. In this example, there are no frequency selective circuits at the RF output, that is, the filter differential signal port 20, in addition to the signal filter 100. A single LC-resonator may be coupled to the filter differential signal port 20 to further clean the spectrum of the output signal significantly. For comparison, graphs c) and d) of FIG. 11 illustrate the corresponding spectra for a prior art up-conversion mixer employing, respectively, a single 4-path TIF and a single 8-path TIF, which exhibit higher power far away from the centre frequency of 500 MHz. Each of the graphs a), b), c) and d) in FIG. 11 have peaks at 1.5 GHz, 2.5 GHz, 3.5 GHz, 4.5 GHz and 5.5 GHz.

In order to realize the 45 degree phase difference between the first TIF clock signals and the second TIF clock signals, a voltage controlled oscillator (VCO) signal may be divided by one divider circuit supplied with a non-inverted version of the VCO signal and another divider circuit supplied with an inverted version of the VCO signal. An accurate 45-degree phase shift may be implemented for differential signals by using clock signal balancing buffers with single-ended duty cycle adjusting circuitry.

Figure 12:
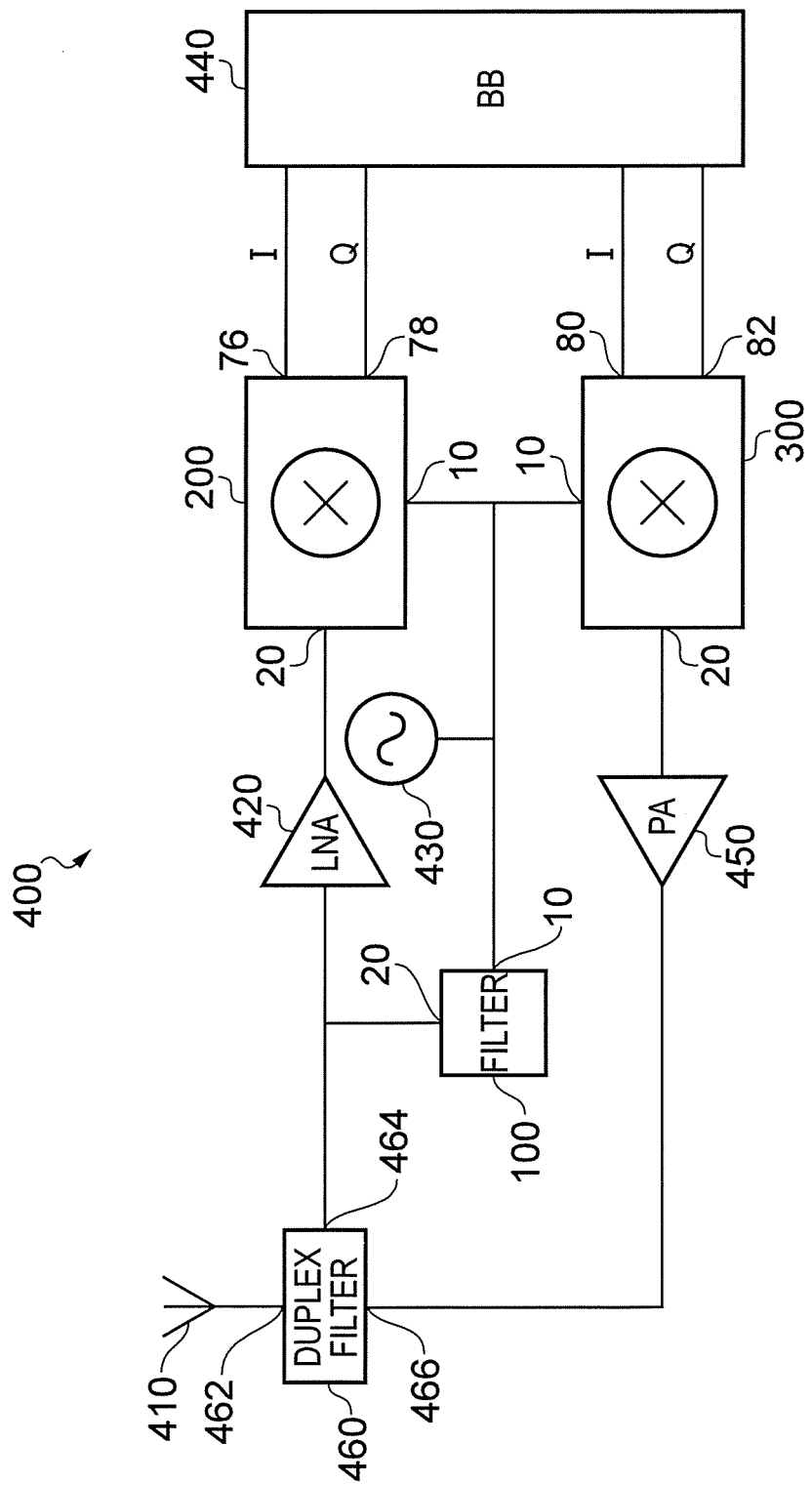
FIG. 12 is a block diagram of a wireless transceiver.

Referring to FIG. 12, a wireless transceiver 400 comprises an antenna 410 coupled to a port 462 of a duplex filter 460. An output 464 of the duplex filter 460 is coupled to an input of a low noise amplifier (LNA) 420. The filter differential port 20 of a signal filter 100 is also coupled to the input of the LNA 420. The signal filter 100 filters a signal received at the antenna 410. An output of the LNA 420 is coupled to the filter differential signal port 20 of the down-conversion mixer 200. The first and second outputs 76, 78 of the down-conversion mixer 200 are coupled to a baseband processor (BB) 440 for demodulating the in-phase and quadrature-phase components of a down-converted signal. A phase locked loop (PLL) 430, coupled to the filter clock input 10 of the signal filter 100, and coupled to the filter clock input 10 of the signal filter 100 of the down-conversion mixer 200, generates the LO signal. The BB 440 is coupled to the in-phase input 80 and the quadrature-phase input 82 of the up-conversion mixer 300. The PLL 430 is also coupled to the filter clock input 10 of the signal filter 100 of the up-conversion mixer 300 for providing the LO signal. The filter differential signal port 20 of the up-conversion mixer 300 is coupled to an input of a power amplifier (PA) 450, and an output of the PA 450 is coupled to an input 466 of the duplex filter 460. The wireless transceiver 400 therefore comprises a transmitter, comprising the BB 440, up-conversion mixer 300, PLL 430, PA 450, duplex filter 460 and antenna 410, and a receiver, comprising the antenna 410, duplex filter 460, filter 100, LNA 420, down-conversion mixer 200, PLL 430, and BB 440. The BB 440, PLL 430, duplex filter 460 and antenna 410 are shared by the transmitter and receiver.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A signal filter comprising:
   a first transferred impedance filter, TIF, having first, second, third and fourth first-TIF differential signal paths;
   a second TIF having first, second, third and fourth second-TIF differential signal paths;
   a first differential signal input port of the first TIF coupled in parallel to a first differential signal input port of the second TIF;
   a first clock generator arranged to provide first-TIF first, second, third and fourth clock signals having non-overlapping phases for respectively selecting the first, second, third and fourth first-TIF differential signal paths via eight switch elements of the first TIF; and
   a second clock generator arranged to provide second-TIF first, second, third and fourth clock signals having non-overlapping phases for respectively selecting the first, second, third and fourth second-TIF differential signal paths via eight switch elements of the second TIF;
   wherein the phases of the second-TIF first, second, third and fourth clock signals are respectively equal to the phases of the first-TIF first, second, third and fourth clock signals delayed by 45 degrees; and
   wherein the first-TIF first, second, third and fourth clock signals and the second-TIF first, second, third and fourth clock signals each have a duty cycle in the range of 16.75% to 25%.

2. A signal filter as claimed in claim 1, wherein the first-TIF first, second, third and fourth clock signals and the second-TIF first, second, third and fourth clock signals each have a duty cycle in the range of 20% to 25%.

3. A signal filter as claimed in claim 1, wherein the first-TIF first, second, third and fourth clock signals and the second-TIF first, second, third and fourth clock signals each have a duty cycle in the range of 16.75% to 20.75%.

4. A signal filter as claimed in claim 1, further comprising:
   first component paths of the first, second, third and fourth first-TIF differential signal paths of the positive component of the first differential signal input port of the first TIF are respectively connected to a first component, a second component, a third component and a fourth component of a second signal port of the first TIF;
   second component paths of the first, second, third and fourth first-TIF differential signal paths of the negative component of the first differential signal input port of the first TIF are respectively connected to the third, fourth, first and second components of the second signal port of the first TIF;
   wherein the first component paths of the first, second, third and fourth first-TIF differential signal paths are respectively selected by means of first-TIF first, second, third and fourth switch elements of the eight switch elements of the first TIF and the second component paths of the first, second, third and fourth first-TIF differential signal paths are respectively selected by means of first-TIF fifth, sixth, seventh, and eighth switch elements of the eight switch elements of the first TIF;
   first component paths of the first, second, third and fourth second-TIF differential signal paths of the positive component of the first differential signal input port of the second TIF are respectively connected to a first component, a second component, a third component and a fourth component of a second signal port of the second TIF;
   second component paths of the first, second, third and fourth second-TIF differential signal paths of the negative component of the first differential signal input port of the second TIF are respectively connected to the third, fourth, first and second components of the second signal port of the second TIF;
   wherein the first component paths of the first, second, third and fourth second-TIF differential signal paths are respectively selected by means of second-TIF first, second, third and fourth switch elements of the eight switch elements of the second TIF and the second component paths of the first, second, third and fourth second-TIF differential signal paths are respectively selected by means of second-TIF fifth, sixth, seventh, and eighth switch elements of the eight switch elements of the second TIF.

5. A signal filter as claimed in claim 4, wherein
the first TIF further comprises first-TIF first, second, third and fourth capacitive elements coupled between a ground and, respectively, the first, second, third and fourth components of the second signal port of the first TIF; and
the second TIF further comprises second-TIF first, second, third and fourth capacitive elements coupled between the ground and, respectively, the first, second, third and fourth components of the second signal port of the second TIF.

6. A signal filter as claimed in claim 4, further comprising:
a first transconductance amplifier configured to deliver to the second component of the second signal port of the first TIF as a first current dependent on a voltage difference of the first and third components of the second signal port of the first TIF, and to deliver to the fourth component of the second signal port of the first TIF as a second current dependent on a voltage difference of the first and third components of the second signal port of the first TIF;
a second transconductance amplifier configured to deliver to the first component of the second signal port of the first TIF as a third current dependent on a voltage difference of the second and fourth components of the second signal port of the first TIF, and to deliver to the third component of the second signal port of the first TIF as a fourth current dependent on a voltage difference of the second and fourth components of the second signal port of the first TIF;
a third transconductance amplifier configured to deliver to the second component of the second signal port of the second TIF as a fifth current dependent on a voltage difference of the first and third components of the second signal port of the second TIF, and to deliver to the fourth component of the second signal port of the second TIF as a sixth current dependent on a voltage difference of the first and third components of the second signal port of the second TIF; and
a fourth transconductance amplifier configured to deliver to the first component of the second signal port of the second TIF as a seventh current dependent on a voltage difference of the second and fourth components of the second signal port of the second TIF, and to deliver to the third component of the second signal port of the second TIF as an eighth current dependent on a voltage difference of the second and fourth components of the second signal port of the second TIF.

7. A down-conversion mixer comprising a signal filter as claimed in claim 4, for down-converting an input signal applied to the first differential signal input port of the first TIF and to the first differential signal input port of the second TIF, and the down-conversion mixer further comprising a combining stage configured to:
generate a first output signal at a first output of the combining stage by adding voltages of the first and second components of the second signal port of the first TIF times a first gain and adding a voltage of the first component of the second signal port of the second TIF times a second gain, subtracting voltages of the third and fourth components of the second signal port of the first TIF times the first gain and subtracting a voltage of the third component of the second signal port of the second TIF times the second gain; and
generate a second output signal at a second output of the combining stage by adding voltages of the second and third components of the second signal port of the first TIF times the first gain and adding a voltage of the second component of the second signal port of the second TIF times the second gain, subtracting voltages of the first and fourth components of the second signal port of the first TIF times the first gain and subtracting a voltage of the fourth component of the second signal port of the second TIF times the second gain;
wherein the second gain is in the range of 1.3 to 1.6 times the first gain.

8. A down-conversion mixer as claimed in claim 7, wherein the second gain is equal to the first gain times 1.5.

9. A down-conversion mixer as claimed in claim 7, wherein the second gain is equal to the first gain times the square root of two.

10. A wireless communication apparatus comprising a signal filter as claimed in claim 1.

11. A method of filtering a signal using a first 4-differential-path transferred impedance filter, TIF, having a first differential signal input port coupled in parallel to a first differential signal input port of a second 4-differential-path transferred impedance filter, the method comprising:
selecting respective differential signal paths of the first 4-differential-path transferred impedance filter with eight switch elements of the first transferred impedance filter controlled by first-TIF clock signals having four non-overlapping phases; and
selecting respective differential signal paths of the second 4-differential-path transferred impedance filter with eight switch elements of the second transferred impedance filter controlled by second-TIF clock signals having four non-overlapping phases;
wherein the phases of the second-TIF clock signals are respectively equal to the phases of the first-TIF clock signals delayed by 45 degrees; and
wherein the first-TIF first clock signals and the second-TIF clock signals each have a duty cycle in the range of 16.75% to 25%.

* * * * *